(12) United States Patent
Kuribayashi et al.

(10) Patent No.: US 12,191,189 B2
(45) Date of Patent: Jan. 7, 2025

(54) INDUSTRIAL ROBOT HAVING A MOUNTING MECHANISM ON WHICH A PLURALITY OF CONVEYANCE OBJECTS IS MOUNTED

(71) Applicant: NIDEC SANKYO CORPORATION, Nagano (JP)

(72) Inventors: Tamotsu Kuribayashi, Nagano (JP); Toshimichi Kazama, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 673 days.

(21) Appl. No.: 17/467,416

(22) Filed: Sep. 6, 2021

(65) Prior Publication Data

US 2022/0093444 A1  Mar. 24, 2022

(30) Foreign Application Priority Data

Sep. 18, 2020 (JP) ................. 2020-157677

(51) Int. Cl.
*B25J 15/00* (2006.01)
*B25J 11/00* (2006.01)
*H01L 21/687* (2006.01)

(52) U.S. Cl.
CPC ..... *H01L 21/68707* (2013.01); *B25J 11/0095* (2013.01); *B25J 15/0052* (2013.01)

(58) Field of Classification Search
CPC ............ H01L 21/68707; B25J 15/0052; B25J 11/0095; B25J 15/08
USPC ...................................... 294/213
See application file for complete search history.

(56) References Cited

U.S. PATENT DOCUMENTS

| | | | | |
|---|---|---|---|---|
| 6,216,883 | B1* | 4/2001 | Kobayashi | H01L 21/68707 211/41.18 |
| 8,454,068 | B2* | 6/2013 | Hashimoto | H01L 21/67748 294/902 |
| 8,559,315 | B2* | 10/2013 | Dudkowski | H04L 45/127 370/237 |
| 11,120,985 | B2* | 9/2021 | Kodama | B24B 53/017 |
| 11,414,278 | B2* | 8/2022 | Kasahara | B65G 47/90 |
| 11,817,342 | B2* | 11/2023 | Pan | H01L 21/67781 |
| 2018/0104827 | A1* | 4/2018 | Goto | H01L 21/68707 |
| 2023/0311334 | A1* | 10/2023 | Shimizu | B25J 15/0014 294/213 |

FOREIGN PATENT DOCUMENTS

| | | | | |
|---|---|---|---|---|
| JP | 2010179420 | | 8/2010 | |
| JP | 2018161729 | A * | 10/2018 | ........ B25J 11/0095 |

* cited by examiner

*Primary Examiner* — Paul T Chin
(74) *Attorney, Agent, or Firm* — JCIPRNET

(57) ABSTRACT

An industrial robot includes a mounting mechanism on which multiple conveyance objects is mounted. The mounting mechanism includes multiple hands overlapped with each other at a predetermined pitch in an upper and lower direction. Each of the hands includes: a fixing part to which a fixed part of the mounting part is fixed, and a bolt for fixing the fixed part to the fixing part. When the mounting mechanism includes a hand having an upward bolt, all of the fixing parts and the fixed parts of the hands disposed on a lower side of the upward bolt are formed with through holes for engaging a tool with a head part of the upward bolt from a lower side of the hand disposed at the bottom. An inside diameter of the through hole is larger than an outside diameter of the head part.

4 Claims, 17 Drawing Sheets

INDUSTRIAL ROBOT HAVING A MOUNTING MECHANISM ON WHICH A PLURALITY OF CONVEYANCE OBJECTS IS MOUNTED

CROSS REFERENCE TO RELATED APPLICATION

The present invention claims priority under 35 U.S.C. § 119 to Japanese Application No. 2020-157677 filed Sep. 18, 2020, and the entire content of which is incorporated herein by reference.

FIELD OF THE INVENTION

At least an embodiment of the present invention may relate to an industrial robot structured to convey a conveyance object such as a semiconductor wafer.

BACKGROUND

Conventionally, an industrial robot structured to convey a substrate such as a semiconductor wafer has been known (for example, see Japanese Patent Laid-Open No. 2010-179420 (Patent Literature 1)). The industrial robot described in Patent Literature 1 includes a substrate mounting mechanism on which a plurality of substrates is mounted and a first arm which turnably supports a base end side of the substrate mounting mechanism. The substrate mounting mechanism includes five hands each of which is provided with a hand fork on which a substrate is mounted, and which are overlapped with each other at a predetermined pitch in an upper and lower direction. The hand is provided with a fork fixing part to which a hand fork is fixed and a bolt having a head for fixing the hand fork to the fork fixing part. The fork fixing part structures a base end side portion of the hand.

In a hand arranged uppermost among the five hands and a hand arranged second from the top, the hand fork is fixed to the fork fixing part by a bolt which is screwed from an upper side. The fork fixing part of the hand arranged uppermost and the fork fixing part of the hand arranged second from the top are disposed at positions shifted to each other in a front and rear direction. The fork fixing part of the hand arranged second from the top is disposed at a position which is not covered by the hand arranged uppermost from the upper side.

Further, in the hand arranged at the bottom and the hand arranged second from the bottom, the hand fork is fixed to the fork fixing part by a bolt screwed from a lower side. The fork fixing part of the hand arranged at the bottom and the fork fixing part of the hand arranged second from the bottom are disposed at positions shifted to each other in the front and rear direction. The fork fixing part of the hand arranged second from the bottom is disposed at a position which is not covered by the hand arranged at the bottom from the lower side.

In addition, the fork fixing part of the hand which is arranged third from the top is disposed at a position shifted in the front and rear direction from the fork fixing parts of the remaining four hands. This fork fixing part is disposed at a position which is not covered from at least one of the upper side and the lower side with respect to the remaining four hands.

Therefore, in the industrial robot described in Patent Literature 1, even when the five hands are disposed so as to be overlapped with each other in the upper and lower direction and, even in a state that the hand forks of all the hands are fixed to the fork fixing parts, the respective bolts of the five hands can be individually attached and detached. Accordingly, in the industrial robot, even when the five hands are disposed so as to be overlapped with each other in the upper and lower direction, the respective hand forks of the five hands are capable of being individually attached to and detached from their fork fixing parts without detaching the hand forks of other hands and thus, maintainability of the industrial robot is enhanced.

In the industrial robot described in Patent Literature 1, in order that the respective hand forks of the five hands are capable of being individually attached to and detached from their fork fixing parts without detaching the hand forks of other hands, the fork fixing part of the uppermost hand and the fork fixing part of the second hand from the top are disposed at positions shifted in the front and rear direction and, in addition, the fork fixing part of the hand at the bottom and the fork fixing part of the second hand from the bottom are disposed at positions shifted in the front and rear direction, and the fork fixing part of the third hand from the top is disposed at a position shifted in the front and rear direction from the fork fixing parts of the remaining four hands. Therefore, in the industrial robot described in Patent Literature 1, while maintainability is enhanced, the base end side portion of the substrate mounting mechanism is enlarged and, as a result, the size of the industrial robot is likely to increase.

Further, in the industrial robot described in Patent Literature 1, in a case that the number of hands provided in the substrate mounting mechanism is increased so as to be capable of conveying more substrates at a time, in order that respective hand forks of a plurality of hands can be individually attached to and detached from their fork fixing parts without detaching hand forks of other hands, when the fork fixing parts of the respective hands are disposed in a state that the respective fork fixing parts of the hands are not overlapped with each other in the upper and lower direction, the base end side portion of the substrate mounting mechanism is further enlarged and, as a result, the size of the industrial robot is likely to further increase.

SUMMARY

At least an embodiment of the present invention may advantageously provide an industrial robot which includes a plurality of hands overlapped with each other at a predetermined pitch in an upper and lower direction and a mounting mechanism on which a plurality of conveyance objects is mounted, the industrial robot being capable of reducing a size of a base end side portion of the mounting mechanism even in a case that each of mounting parts of the plurality of the hands is capable of being individually attached and detached without detaching mounting parts of other hands.

According to at least an embodiment of the present invention, there may be provided an industrial robot including a mounting mechanism on which a plurality of conveyance objects is mounted. The mounting mechanism includes a plurality of hands whose number is at least three or more, each of the hands including a mounting part for the conveyance object, and the plurality of the hands being overlapped with each other at a predetermined pitch in an upper and lower direction, and each of the hands includes a fixing part to which a fixed part of the mounting part is fixed and a bolt having a head for fixing the fixed part to the fixing part. The fixing parts of the plurality of the hands are overlapped with each other at the predetermined pitch in the upper and lower direction, and the fixed part is fixed to the fixing part in a state that the fixed part is overlapped with the fixing part in the upper and lower direction by the bolt disposed with the upper and lower direction as an axial direction. When the bolt whose head part is disposed on a lower side is referred to as an upward bolt, and the bolt whose head part is disposed on an upper side is referred to as a downward bolt and, when each of the hands having the upward bolt except the hand disposed uppermost and except the hand disposed at the bottom among the plurality of the hands is referred to as a first hand, and each of the hands having the downward bolt except the hand disposed uppermost and except the hand disposed at the bottom among the plurality of the hands is referred to as a second hand, in a case that the mounting mechanism includes the first hand, all of the fixing parts and the fixed parts of the hands which are disposed on a lower side with respect to the upward bolt of the first hand are formed with through holes for engaging a tool with the head part of the upward bolt of the first hand from a lower side with respect to the hand disposed at the bottom and, in a case that the mounting mechanism includes the second hand, all of the fixing parts and the fixed parts of the hands which are disposed on an upper side with respect to the downward bolt of the second hand are formed with through holes for engaging a tool with the head part of the downward bolt of the second hand from an upper side with respect to the hand disposed uppermost, and an inside diameter of the through hole is larger than an outside diameter of the head part.

In the industrial robot in accordance with at least an embodiment of the present invention, a hand includes a fixing part to which a fixed part of a mounting part is fixed and a bolt having a head for fixing the fixed part to the fixing part, and the fixed part is fixed to the fixing part in an overlapped state with the fixing part in the upper and lower direction by a bolt disposed with the upper and lower direction as an axial direction. Further, in at least an embodiment of the present invention, the fixing parts of the plurality of the hands are overlapped with each other at a predetermined pitch in the upper and lower direction. In this case, when the mounting mechanism includes the first hand, all of the fixing parts and the fixed parts of the hands which are disposed on a lower side with respect to an upward bolt of the first hand are formed with through holes for engaging a tool with the head part of the upward bolt of the first hand from a lower side with respect to the hand disposed at the bottom and, when the mounting mechanism includes the second hand, all of the fixing parts and the fixed parts of the hands which are disposed on an upper side with respect to a downward bolt of the second hand are formed with through holes for engaging a tool with the head part of the downward bolt of the second hand from an upper side with respect to the hand disposed uppermost. In addition, in at least an embodiment of the present invention, an inside diameter of the through hole is larger than an outside diameter of the head part.

Therefore, in at least an embodiment of the present invention, even when the fixing parts of the plurality of the hands are overlapped with each other in the upper and lower direction and, even in a state that the mounting parts of all of the hands are fixed to the fixing parts, respective bolts of the plurality of the hands can be attached and detached by using a tool from a lower side with respect to the hand disposed at the bottom, or from an upper side with respect to the hand disposed uppermost. Accordingly, in at least an embodiment of the present invention, even in a case that the fixing parts of the plurality of the hands are overlapped with each other in the upper and lower direction, each of the mounting parts of the plurality of the hands is capable of being individually attached and detached without detaching the mounting parts of other hands. Further, in at least an embodiment of the present invention, the fixing parts of the plurality of the hands are overlapped with each other in the upper and lower direction and thus, a size of a base end side portion of the mounting mechanism can be reduced. In other words, in at least an embodiment of the present invention, a size of the base end side portion of the mounting mechanism can be reduced while each of the mounting parts of the plurality of the hands is capable of being individually attached and detached without detaching the mounting parts of other hands.

In at least an embodiment of the present invention, the bolt provided in the hand which is disposed uppermost is the downward bolt, and the bolts provided in remaining hands of the plurality of the hands except the hand disposed uppermost are the upward bolts. According to this structure, the upward bolt loosened by a tool can be dropped to a lower side with respect to the hand disposed at the bottom by its own weight. Therefore, the bolts provided in the remaining hands except the hand disposed uppermost can be easily detached and, as a result, a detaching operation of the bolt can be performed easily.

In at least an embodiment of the present invention, each of the hands is linearly moved in a horizontal direction at a time of conveyance of the conveyance object and, when a direction perpendicular to a moving direction of each of the hands and the upper and lower direction is referred to as an orthogonal direction, the fixed part is fixed to the fixing part by the bolts disposed on both sides in the orthogonal direction with respect to a center of each of the hands in the orthogonal direction, and the bolts provided in the remaining hands of the plurality of the hands except the hand disposed uppermost are successively shifted to an inner side in the orthogonal direction from the hand disposed on an upper side to the hand disposed on a lower side. According to this structure, even when the fixing parts of the plurality of the hands are overlapped with each other at a predetermined pitch in the upper and lower direction and the positions of the bolts provided in the remaining hands except the hand disposed uppermost are hard to be visually confirmed from an upper side, the positions in a horizontal direction of the bolts provided in the remaining hands except the hand disposed uppermost are easily grasped.

In at least an embodiment of the present invention, the mounting part includes a mounting part main body on which the conveyance object is mounted, and the mounting part main body is separately formed from the fixed part. In at least an embodiment of the present invention, a shape of the fixed part may be required to change for each of a plurality of hands depending on the number of through holes and the like formed in the fixed part. However, according to this structure, the mounting part main body can be formed in a common shape for all the hands. Therefore, a component cost of a hand can be reduced.

As described above, in at least an embodiment of the present invention, in an industrial robot which includes a plurality of hands overlapped with each other at a predetermined pitch in an upper and lower direction and a mounting mechanism on which a plurality of conveyance objects is mounted, a size of a base end side portion of the mounting mechanism can be reduced even in a case that each of mounting parts of the plurality of the hands is capable of being individually attached and detached without detaching mounting parts of other hands.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An embodiment of the present invention will be described below with reference to the accompanying drawings.
(Entire Structure of Industrial Robot)

Figure 1:
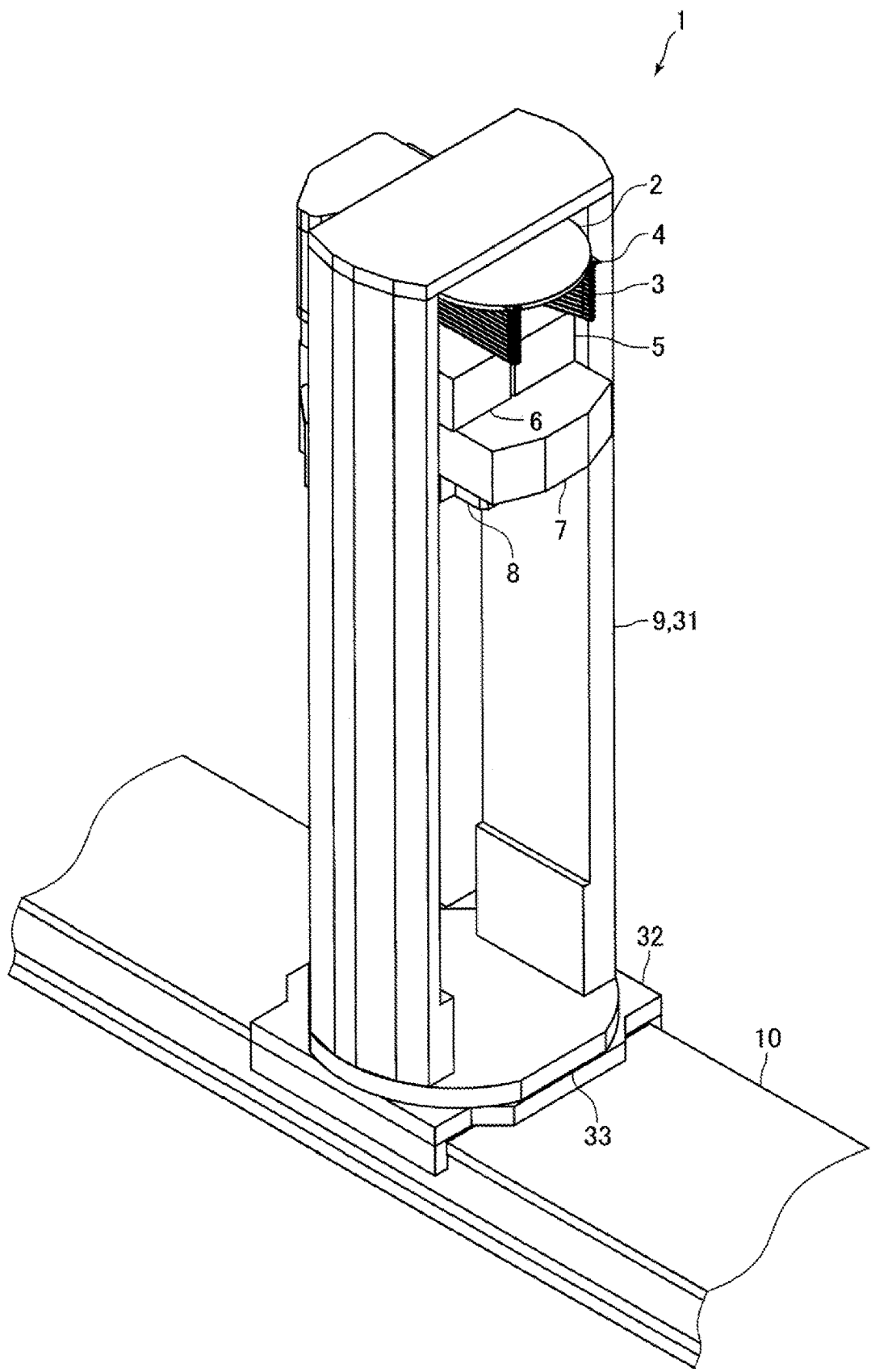
FIG. 1 is a perspective view showing an industrial robot in accordance with at least an embodiment of the present invention.
Figure 2:
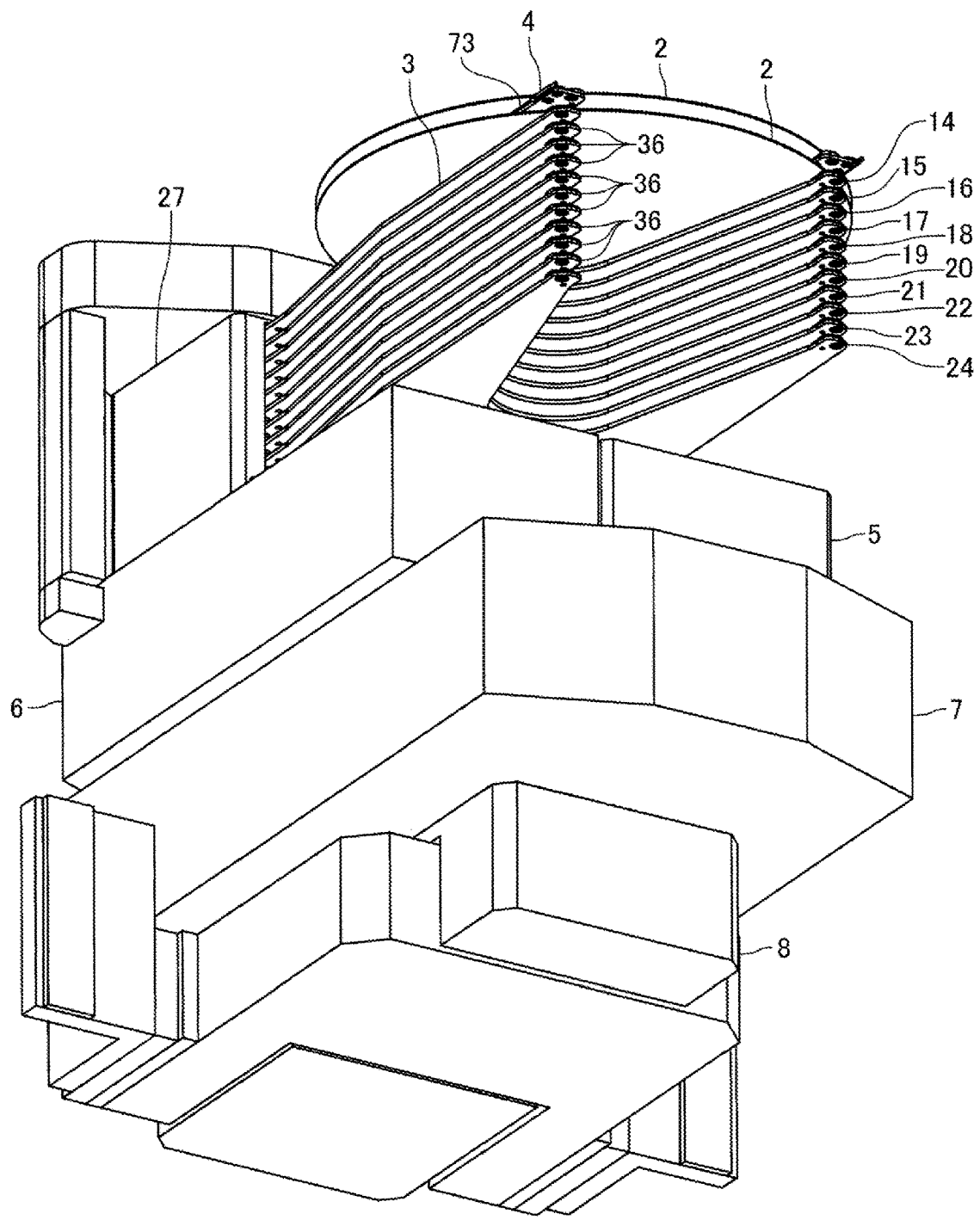
FIG. 2 is a perspective view showing a mounting mechanism, linear drive mechanisms, an inclination correcting mechanism and the like shown in FIG. 1.
Figure 3:
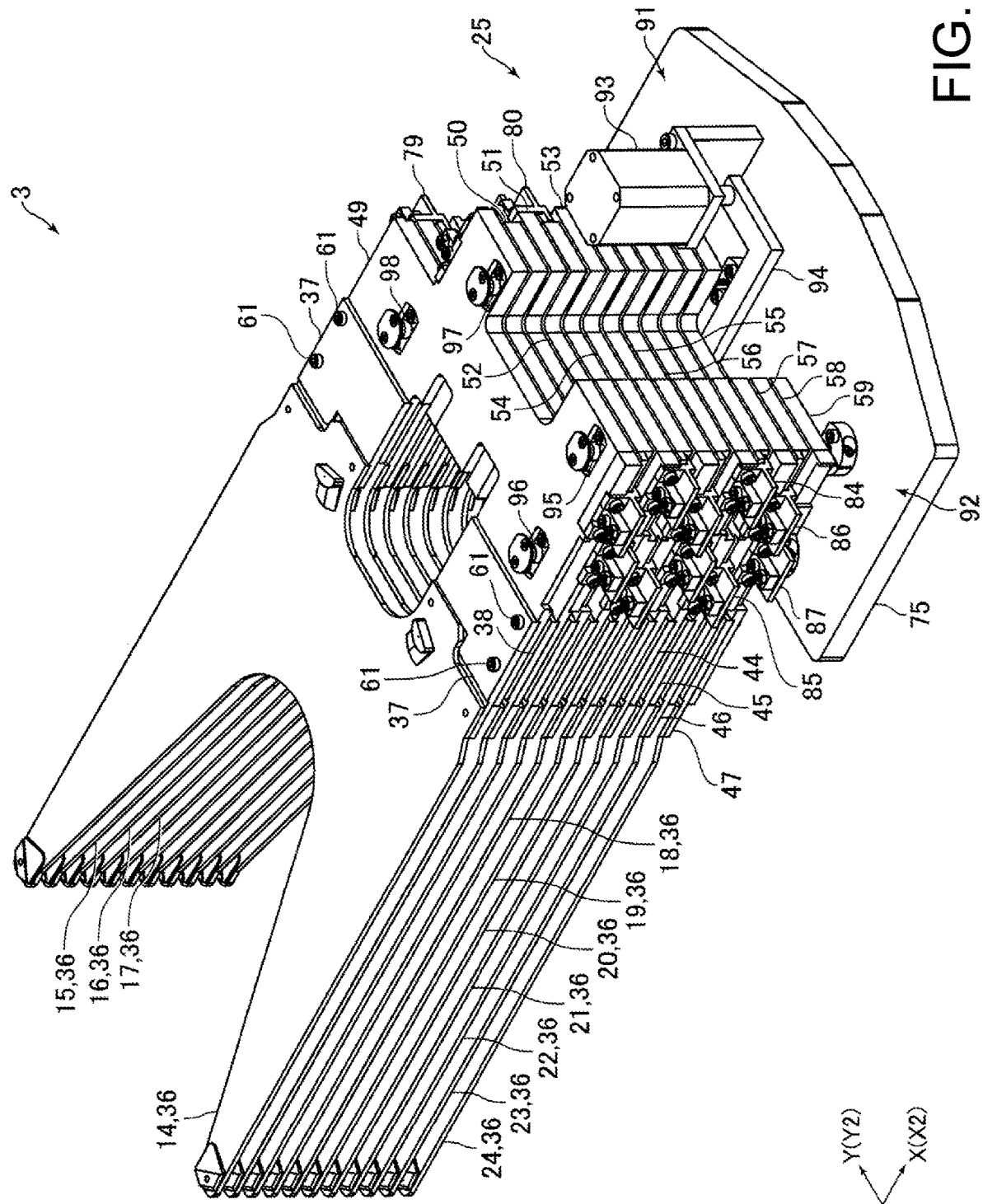
FIG. 3 is a perspective view showing the mounting mechanism in FIG. 1.

FIG. 1 is a perspective view showing an industrial robot 1 in accordance with at least an embodiment of the present invention. FIG. 2 is a perspective view showing a mounting mechanism 3, linear drive mechanisms 5 through 7, an inclination correcting mechanism 8 and the like shown in FIG. 1. FIG. 3 is a perspective view showing the mounting mechanism 3 in FIG. 1.

An industrial robot 1 (hereinafter, referred to as a "robot 1") in this embodiment is a robot structured to convey a semiconductor wafer 2 (hereinafter, referred to as a "wafer 2") which is a conveyance object. A wafer 2 is formed in a thin circular plate shape. The robot 1 is, for example, structured so as to simultaneously carry out a plurality of wafers 2 from a cassette (not shown) in which a plurality of the wafers 2 is laminated and accommodated at a predetermined pitch and carry the plurality of the wafers 2 having been carried out from the cassette into an inside of a predetermined processing apparatus structuring a semiconductor manufacturing system (not shown). Further, the robot 1 simultaneously carries out a plurality of wafers 2 from the processing apparatus in which the plurality of the wafers 2 is laminated and accommodated at a predetermined pitch and carries the plurality of the wafers 2 having been carried out into an inside of a cassette.

The robot 1 includes a mounting mechanism 3 on which a plurality of wafers 2 is mounted, a hand 4 on which a wafer 2 is mounted, a linear drive mechanism 5 structured to linearly move the mounting mechanism 3 in a horizontal direction, a linear drive mechanism 6 structured to linearly move the hand 4 in the horizontal direction, a linear drive mechanism 7 structured to linearly move the linear drive mechanisms 5 and 6 in the horizontal direction, an inclination correcting mechanism 8 structured to correct an inclination of the mounting mechanism 3 and the hand 4, a main body part 9 which holds the inclination correcting mechanism 8, and a base member 10 which movably supports the main body part 9 in the horizontal direction.

The mounting mechanism 3 is mounted with a plurality of wafers 2 which are overlapped with each other at a constant pitch in an upper and lower direction. The mounting mechanism 3 includes a plurality of hands 14 through 24 on each of which a wafer 2 is mounted. The mounting mechanism 3 in this embodiment includes eleven hands 14 through 24. Each of the hands 14 through 24 is mounted with a wafer 2. Eleven hands 14 through 24 are overlapped with each other at a predetermined pitch in the upper and lower direction. Specifically, the eleven hands 14 through 24 are overlapped with each other at a constant pitch. The eleven hands 14 through 24 are directed in the same direction.

Further, the mounting mechanism 3 includes a pitch change mechanism 25 structured to change the pitch in the upper and lower direction of the eleven hands 14 through 24. A hand 4 is disposed on an upper side with respect to the hands 14 through 24. The hand 4 is directed in the same direction as the hands 14 through 24. Specific structures of the hands 14 through 24 and the pitch change mechanism 25 will be described below. A base end side portion of the mounting mechanism 3 is covered by a cover 27 (see FIG. 2), but the cover 27 is not shown in FIG. 3 and the like.

The linear drive mechanism 5 linearly reciprocates the mounting mechanism 3. In other words, the linear drive mechanism 5 linearly reciprocates the eleven hands 14 through 24. The linear drive mechanism 5 is disposed on a lower side with respect to the hands 14 through 24. The linear drive mechanism 5 includes, for example, a motor, a ball screw, a guide mechanism and the like. The linear drive mechanism 6 linearly reciprocates the hand 4 in the same direction as the reciprocation direction of the hands 14 through 24 which are moved by the linear drive mechanism 5. The linear drive mechanism 6 is disposed on a lower side with respect to the hands 14 through 24. Similarly to the linear drive mechanism 5, the linear drive mechanism 6 includes, for example, a motor, a ball screw, a guide mechanism and the like.

The linear drive mechanism 7 linearly reciprocates the linear drive mechanisms 5 and 6 in the same direction as the reciprocation direction of the hands 4 and 14 through 24 which are moved by the linear drive mechanisms 5 and 6. In other words, the linear drive mechanism 7 further reciprocates the hands 14 through 24 together with the linear drive mechanism 5 and further reciprocates the hand 4 together with the linear drive mechanism 6 in the same direction as the reciprocation direction of the hands 4 and 14 through 24 which are moved by the linear drive mechanisms 5 and 6. The linear drive mechanism 7 is disposed on a lower side with respect to the linear drive mechanisms 5 and 6. Similarly to the linear drive mechanism 5 and 6, the linear drive mechanism 7 includes, for example, two motors, two ball screws, guide mechanisms and the like.

The inclination correcting mechanism 8 is disposed on a lower side with respect to the linear drive mechanism 7. The linear drive mechanism 7 is mounted on the inclination correcting mechanism 8. The inclination correcting mechanism 8 corrects an inclination of the hands 4 and 14 through 24 on each of which a wafers 2 is mounted by inclining the linear drive mechanism 7. The inclination correcting mechanism 8 includes a first inclination correcting mechanism structured to turn the hands 4 and 14 through 24 together with the linear drive mechanism 7 and the like with a predetermined first direction inclined with respect to the upper and lower direction as an axial direction of turning, and a second inclination correcting mechanism structured to turn the hands 4 and 14 through 24 together with the linear drive mechanism 7 and the like with a second direction inclined with respect to the upper and lower direction and inclined with respect to the first direction as an axial direction of turning. The first direction is substantially coincided with the reciprocation direction of the mounting mechanism 3 and the hand 4. The second direction is a direction perpendicular to the first direction.

The main body part 9 includes a pillar-shaped frame 31 which holds the inclination correcting mechanism 8 so as to be movable up and down. The pillar-shaped frame 31 is formed in a pillar shape which is long and slender in the upper and lower direction. Further, the main body part 9 includes a base 32, which structures a lower end part of the main body part 9 and is capable of horizontally moving with respect to the base member 10, and a turnable base 33 to which a lower end of the pillar-shaped frame 31 is fixed and which is turnable with respect to the base 32. The robot 1 includes a lifting mechanism structured to move the inclination correcting mechanism 8 up and down with respect to the pillar-shaped frame 31, a turning mechanism structured to turn the turnable base 33 with respect to the base 32 with the upper and lower direction as an axial direction of turning, and a horizontal movement mechanism structured to horizontally move the base 32 with respect to the base member 10.

(Structure of Hand)

Figure 4:
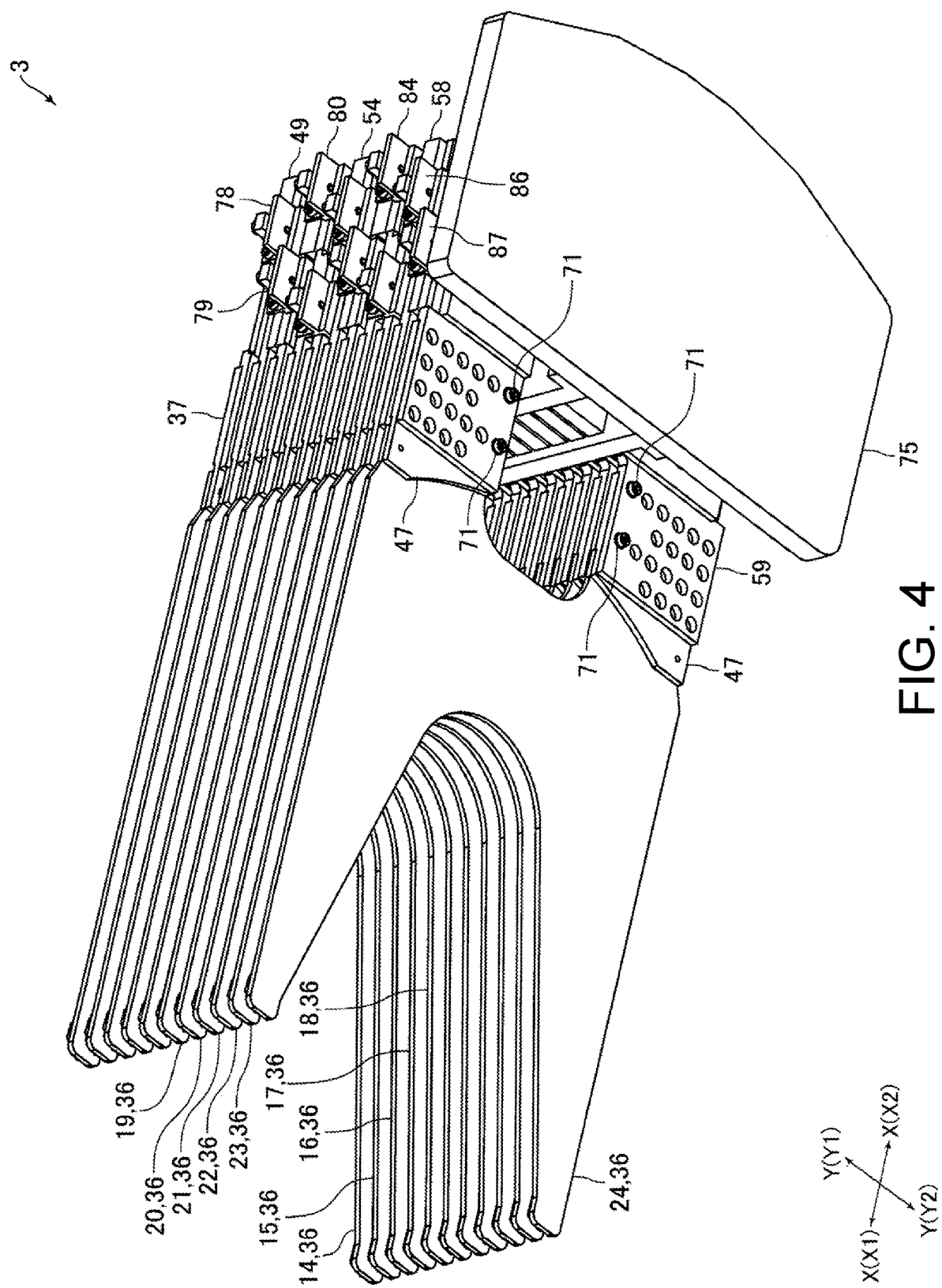
FIG. 4 is a perspective view showing the mounting mechanism in FIG. 3 which is viewed in a different direction.
Figure 5:
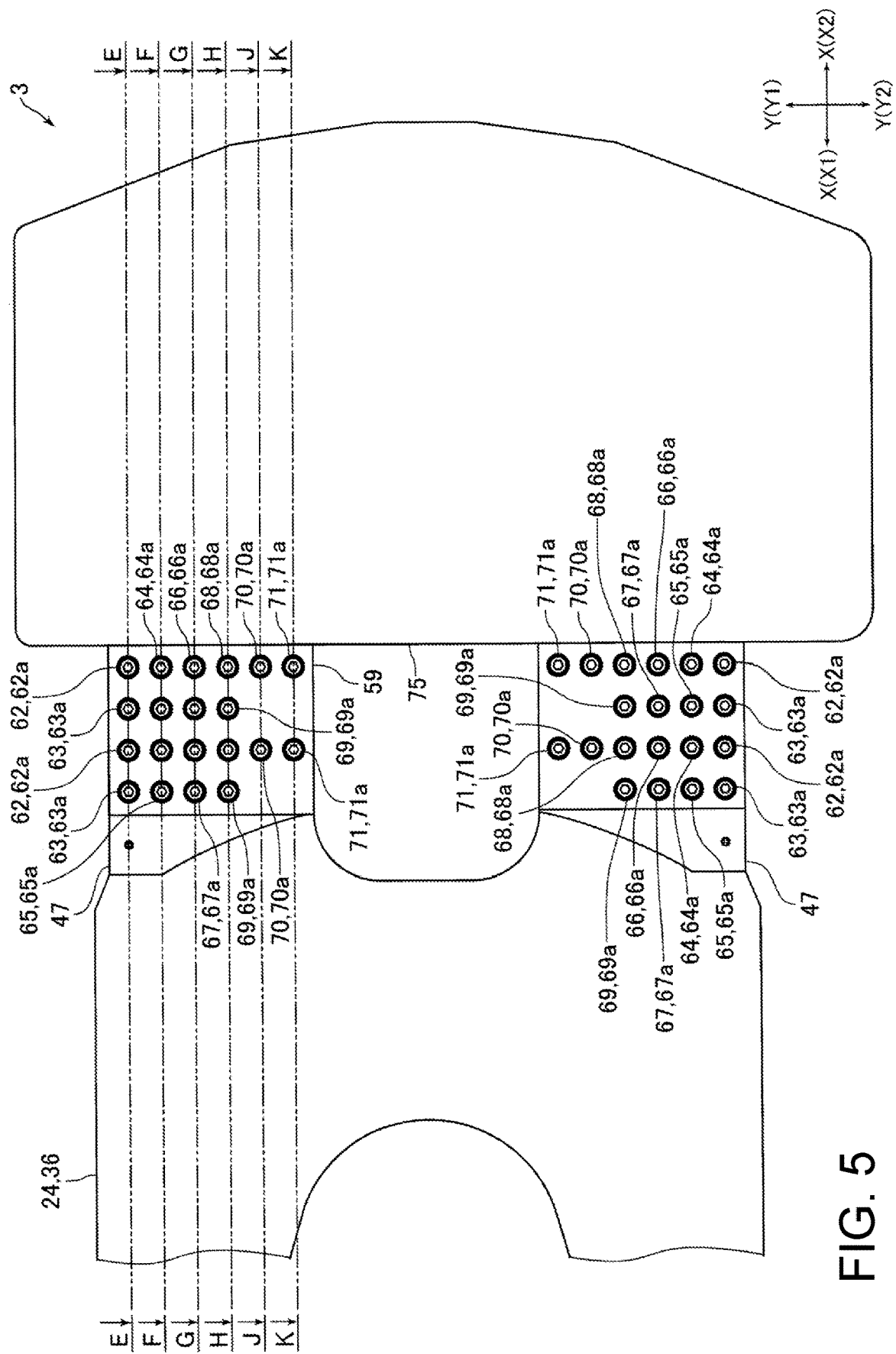
FIG. 5 is a bottom view showing a part of the mounting mechanism in FIG. 3.
Figure 6:
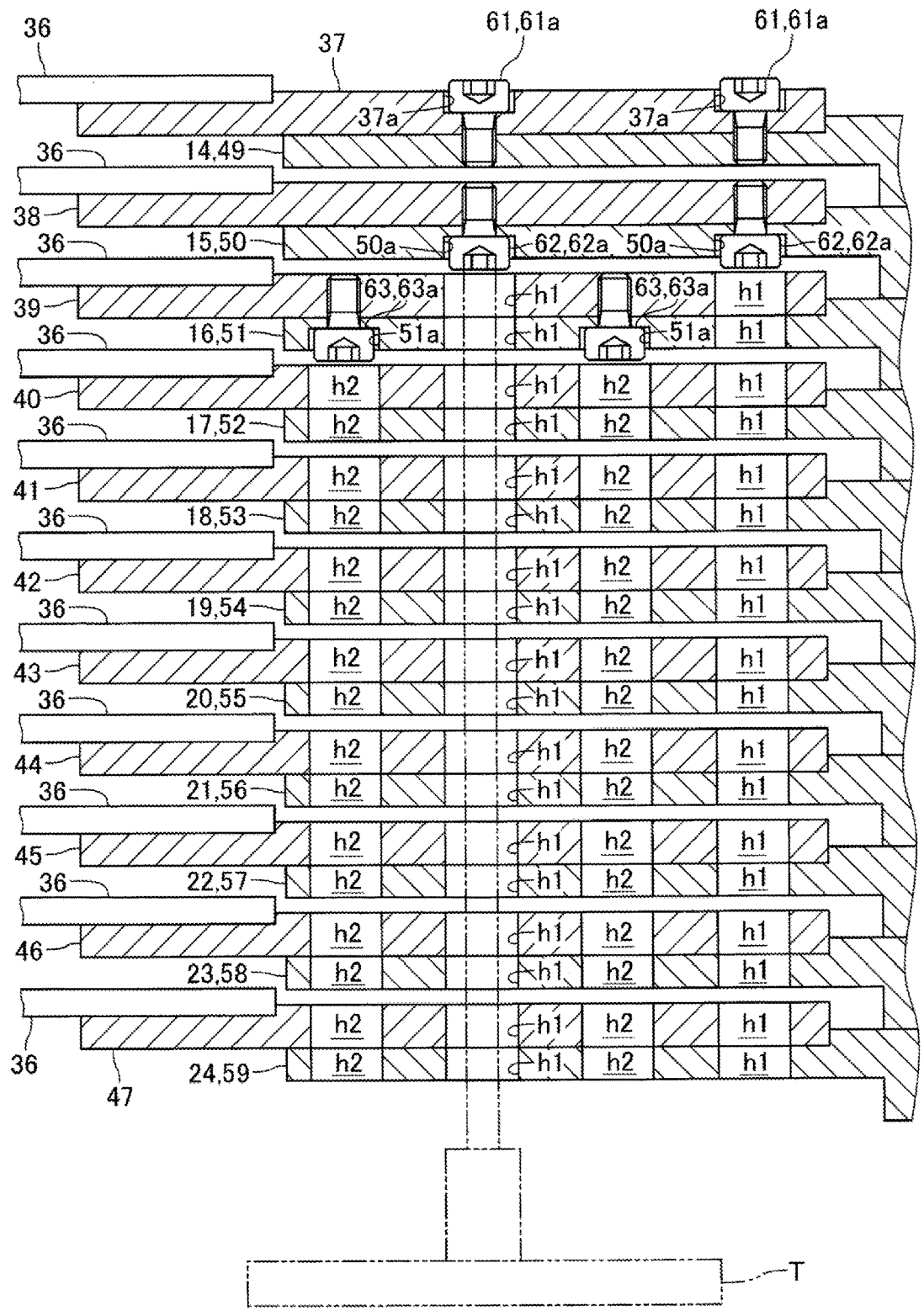
FIG. 6 is an explanatory cross-sectional view showing a structure of the "E-E" cross section in FIG. 5.
Figure 7:
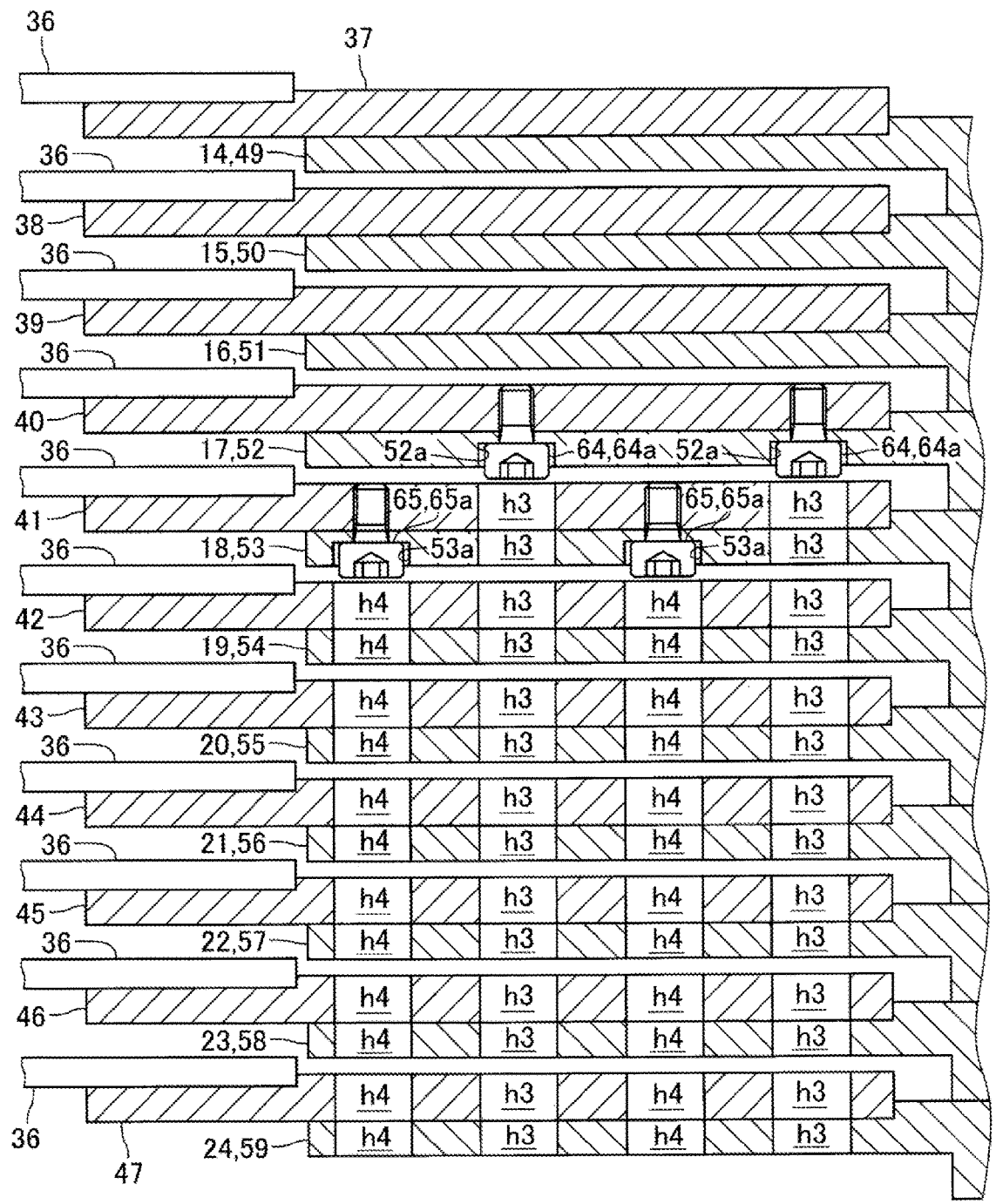
FIG. 7 is an explanatory cross-sectional view showing a structure of the "F-F" cross section in FIG. 5.
Figure 8:
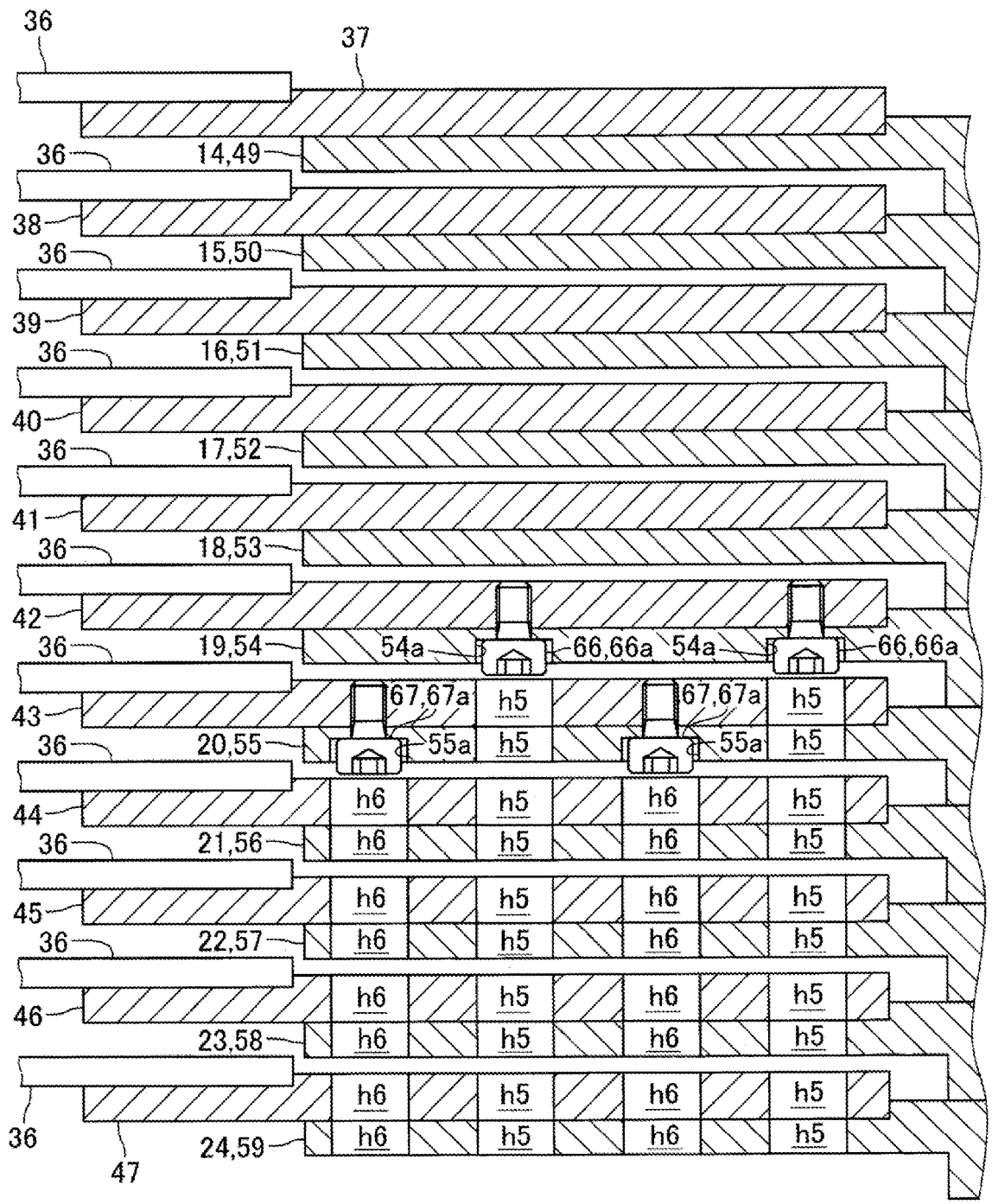
FIG. 8 is an explanatory cross-sectional view showing a structure of the "G-G" cross section in FIG. 5.
Figure 9:
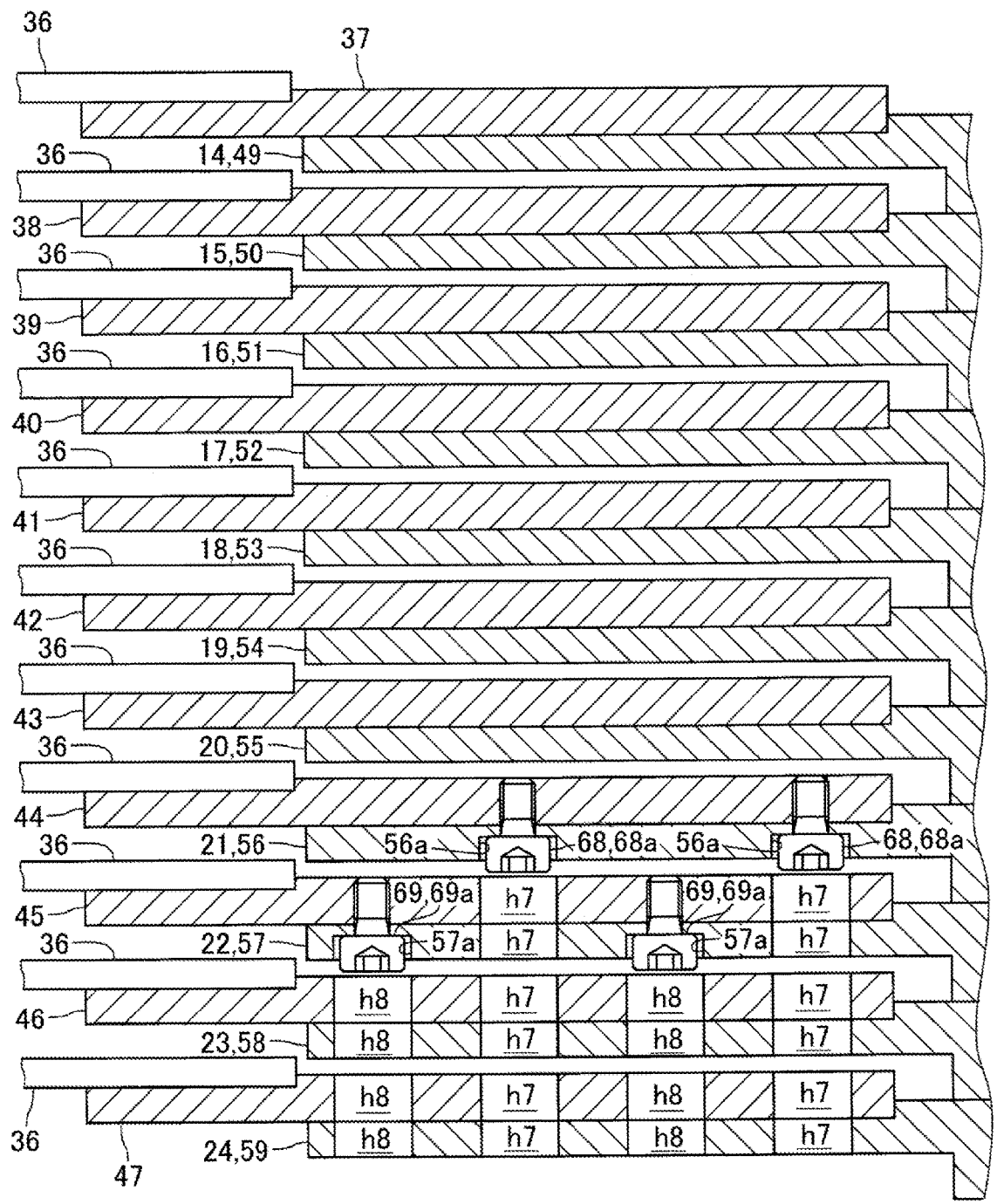
FIG. 9 is an explanatory cross-sectional view showing a structure of the "H-H" cross section in FIG. 5.
Figure 10:
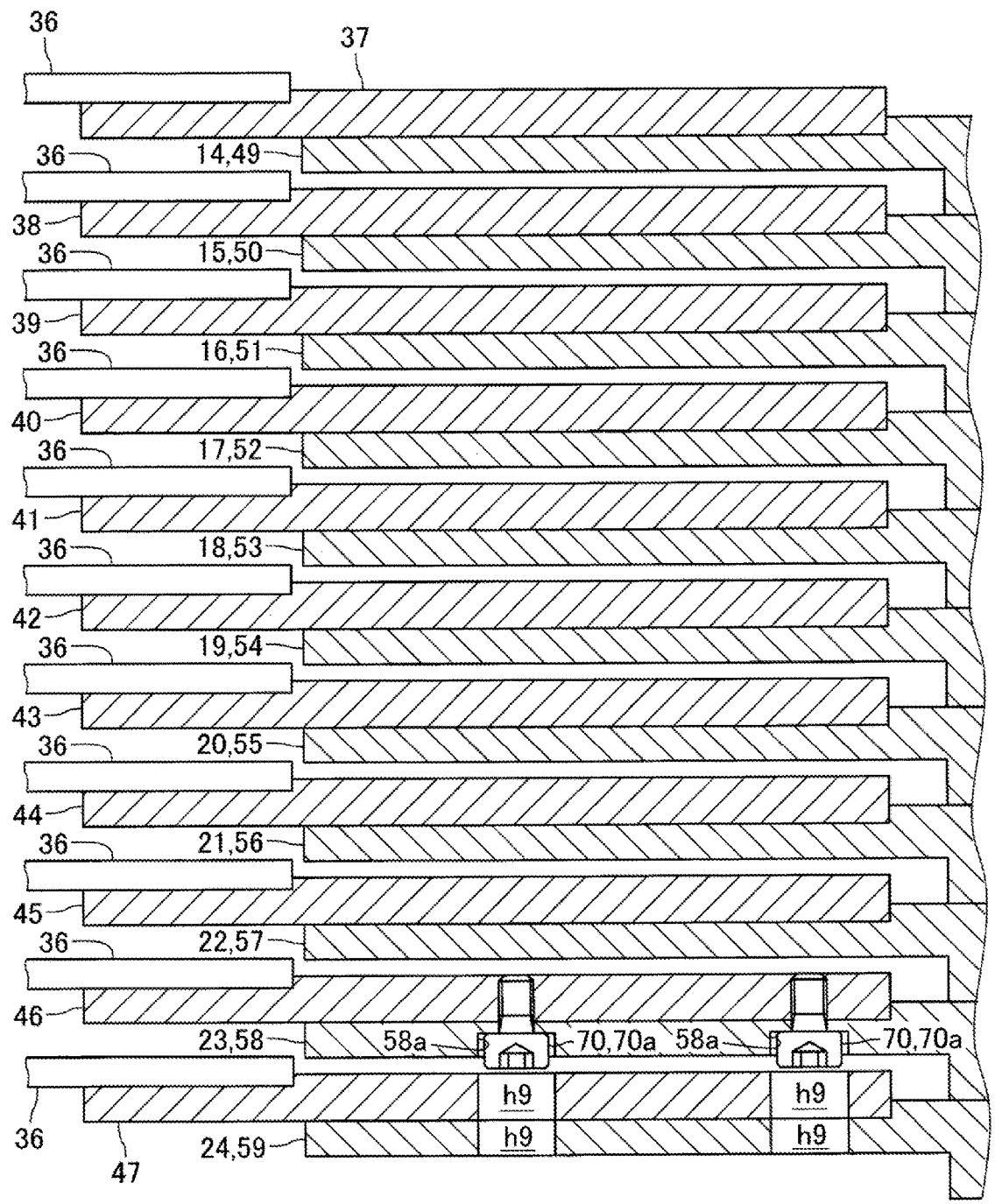
FIG. 10 is an explanatory cross-sectional view showing a structure of the "J-J" cross section in FIG. 5.
Figure 11:
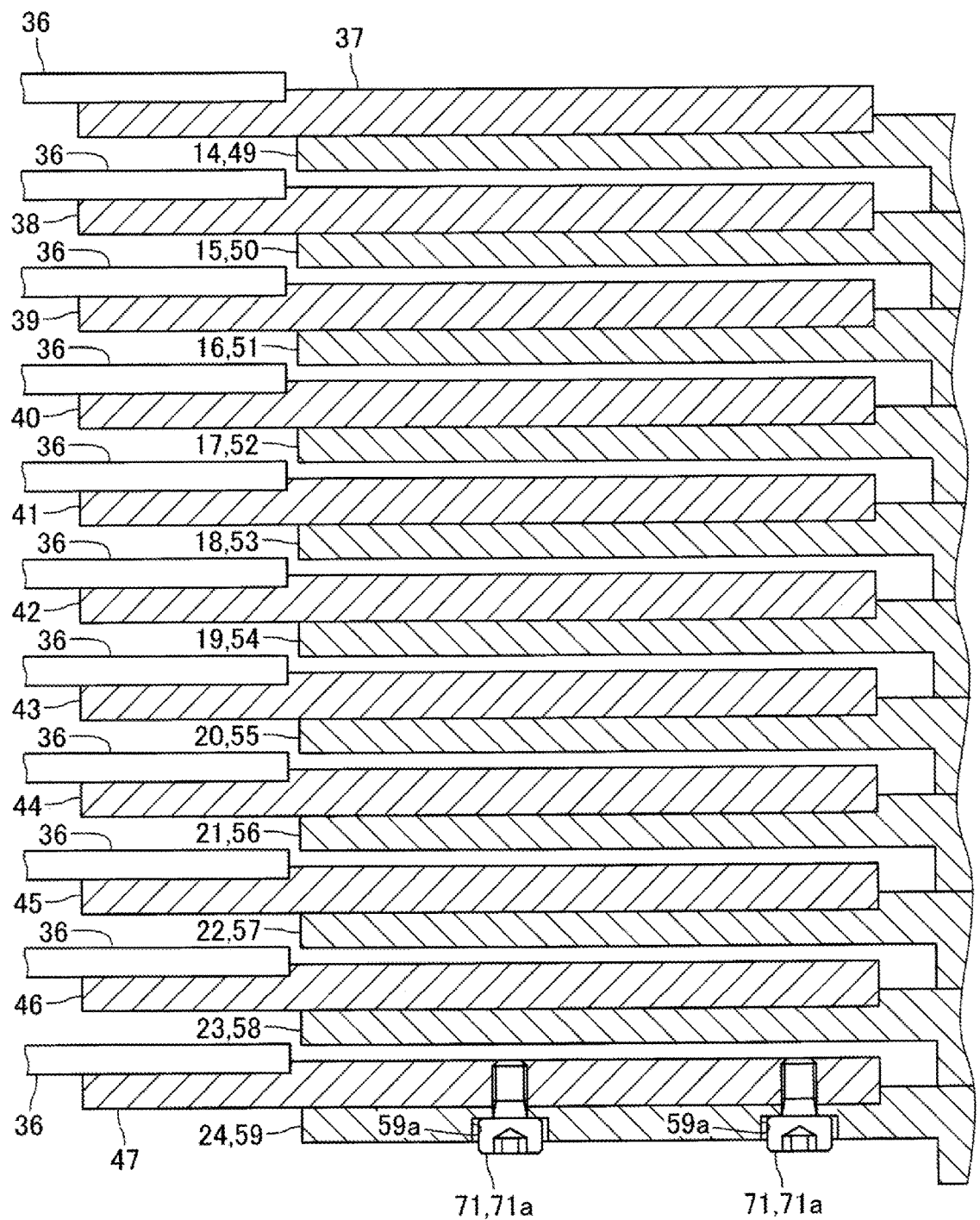
FIG. 11 is an explanatory cross-sectional view showing a structure of the "K-K" cross section in FIG. 5.
Figure 12:
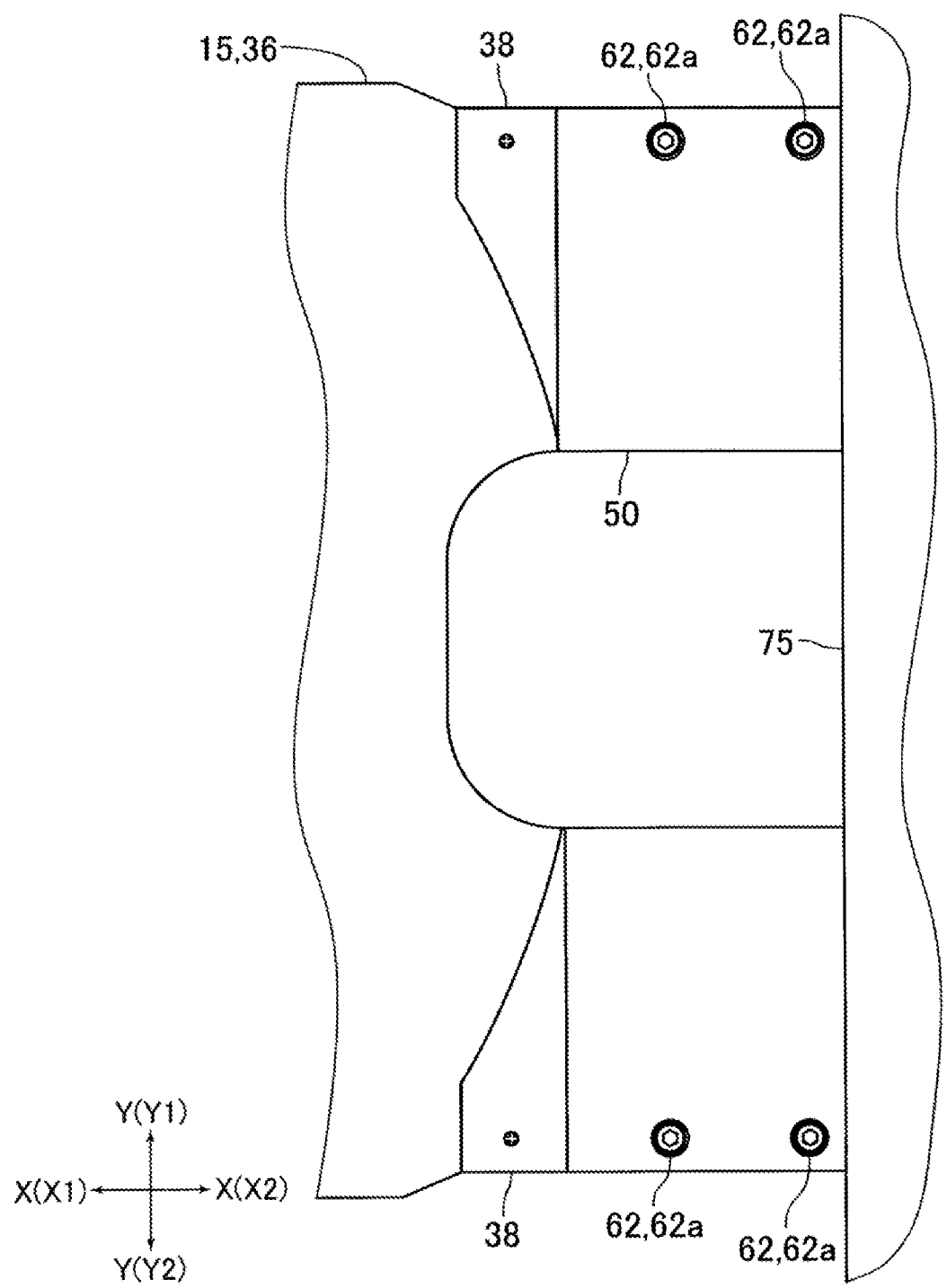
FIG. 12 is an explanatory bottom view showing a structure of a hand which is disposed second from the top in FIG. 3.
Figure 13:
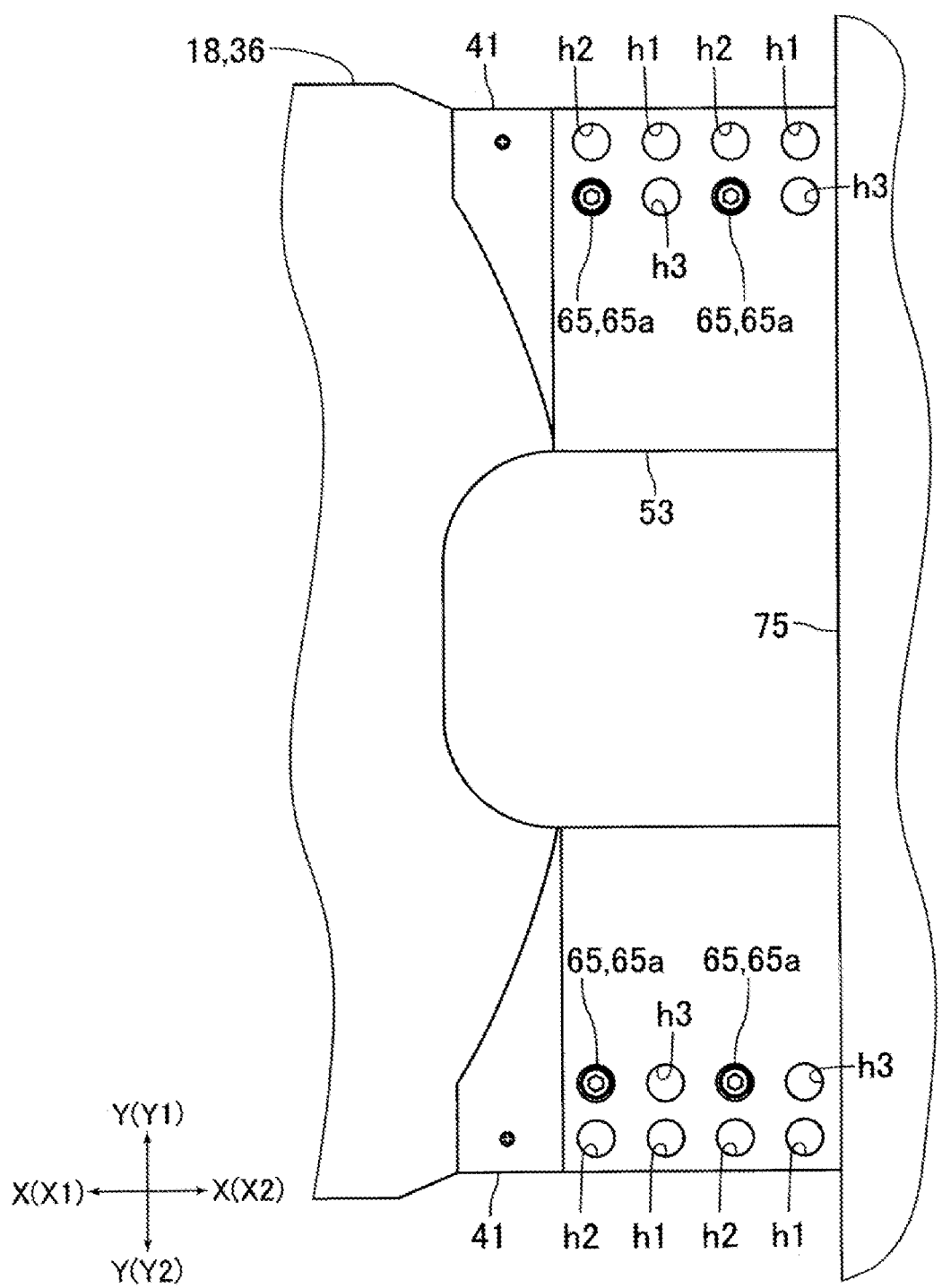
FIG. 13 is an explanatory bottom view showing a structure of a hand which is disposed fifth from the top in FIG. 3.
Figure 14:
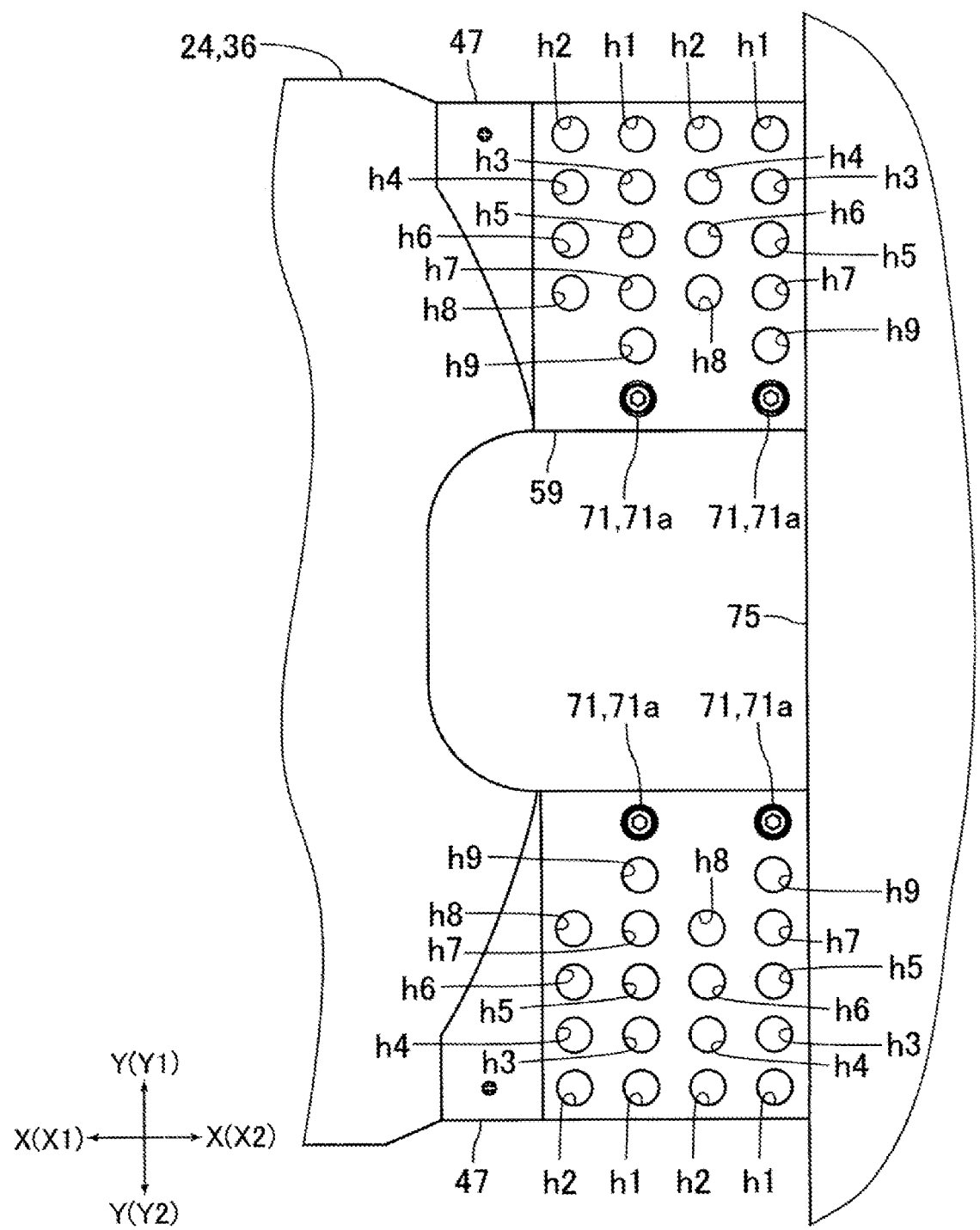
FIG. 14 is an explanatory bottom view showing a structure of a hand which is disposed at the bottom in FIG. 3.
Figure 15:
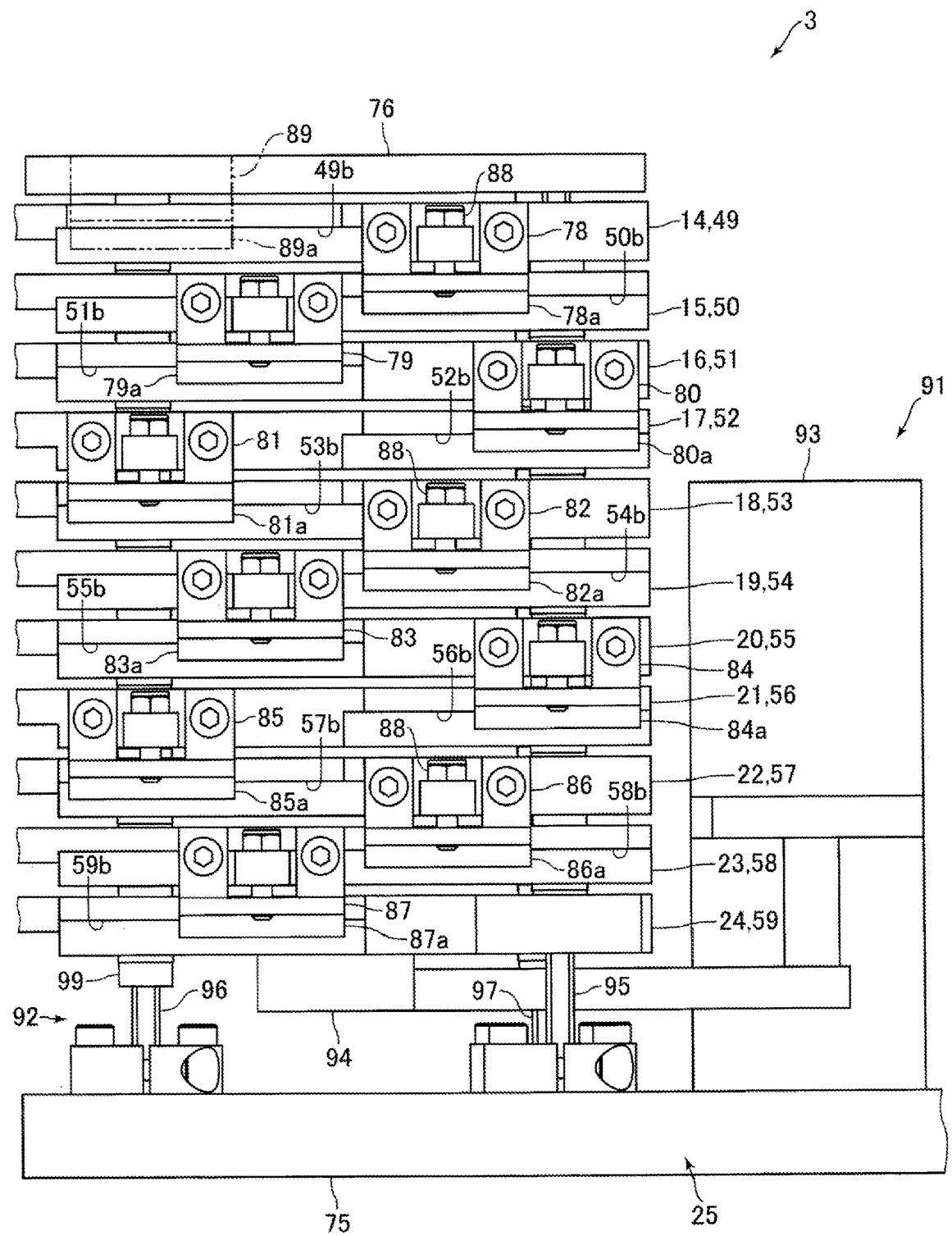
FIG. 15 is a side view showing a base end part of the mounting mechanism in FIG. 3.
Figure 16:
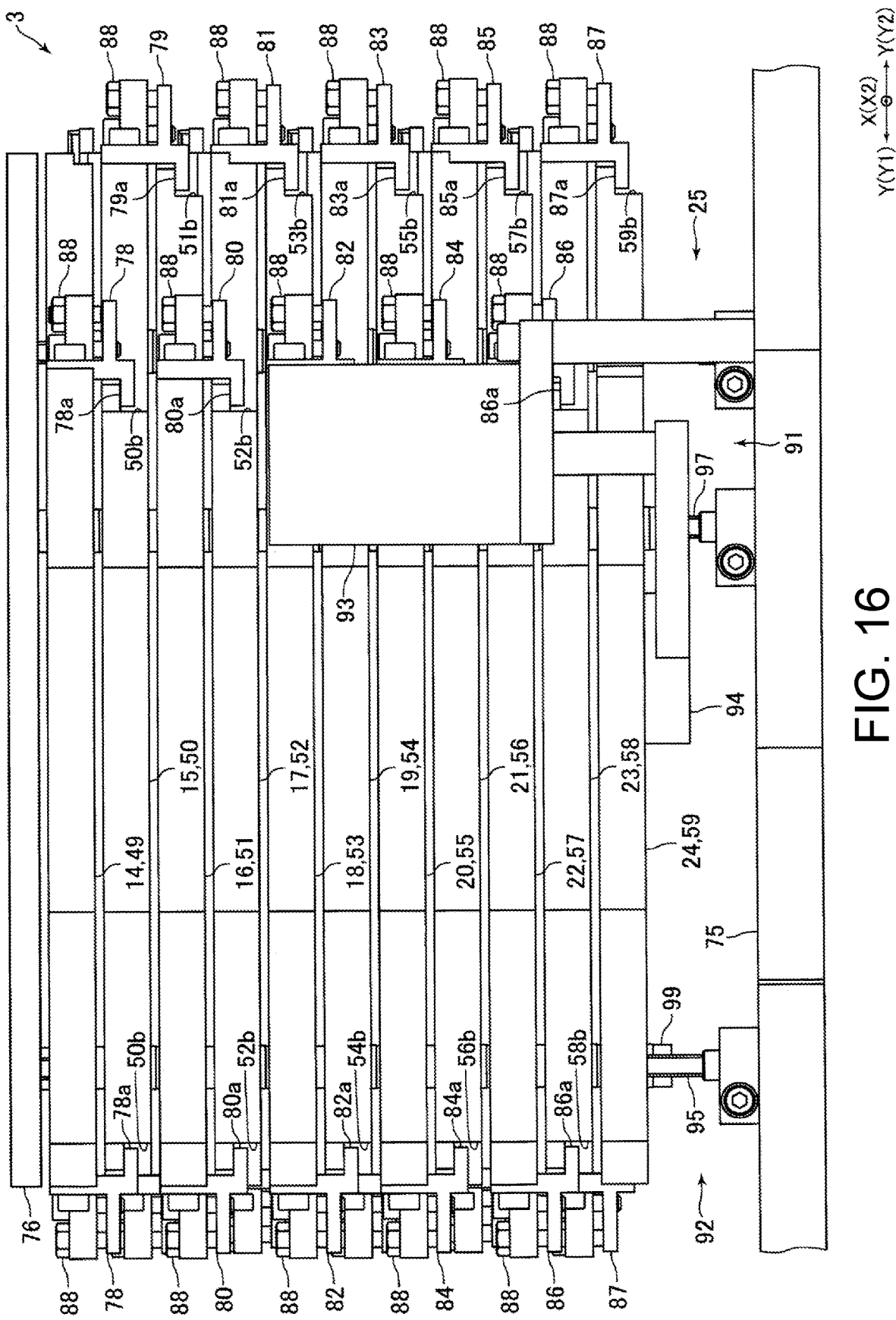
FIG. 16 is a rear view showing the mounting mechanism in FIG. 3.
Figure 17:
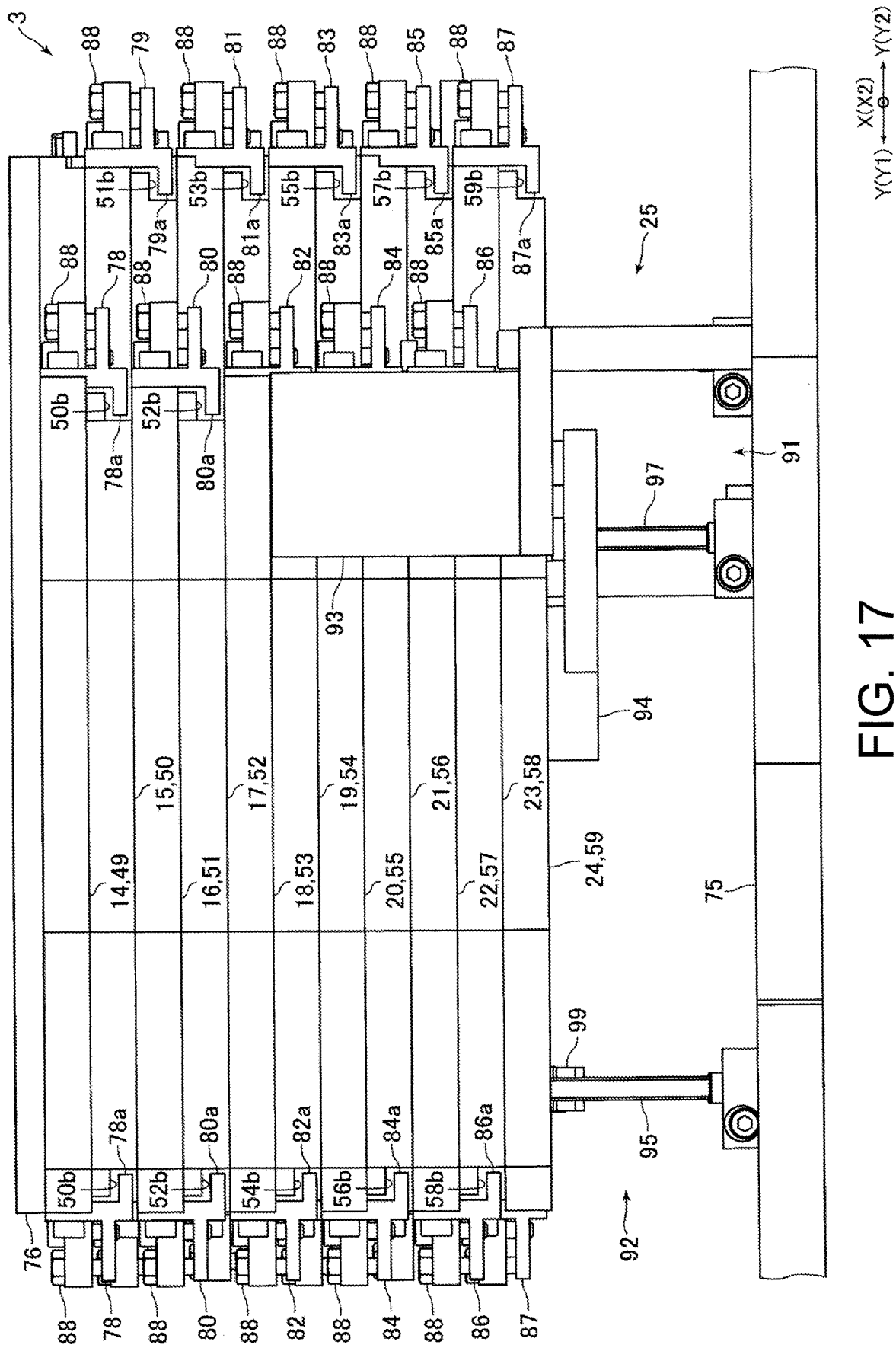
FIG. 17 is a rear view showing the mounting mechanism in FIG. 3.

FIG. 4 is a perspective view showing the mounting mechanism 3 in FIG. 3 which is viewed in a different direction. FIG. 5 is a bottom view showing a part of the mounting mechanism 3 in FIG. 3. FIG. 6 is an explanatory cross-sectional view showing a structure of the "E-E" cross section in FIG. 5. FIG. 7 is an explanatory cross-sectional view showing a structure of the "F-F" cross section in FIG. 5. FIG. 8 is an explanatory cross-sectional view showing a structure of the "G-G" cross section in FIG. 5. FIG. 9 is an explanatory cross-sectional view showing a structure of the "H-H" cross section in FIG. 5. FIG. 10 is an explanatory cross-sectional view showing a structure of the "J-J" cross section in FIG. 5. FIG. 11 is an explanatory cross-sectional view showing a structure of the "K-K" cross section in FIG. 5. FIG. 12 is an explanatory bottom view showing a structure of a hand 15 in FIG. 3. FIG. 13 is an explanatory bottom view showing a structure of a hand 18 in FIG. 3. FIG. 14 is an explanatory bottom view showing a structure of a hand 24 in FIG. 3. FIG. 15 is a side view showing a base end part of the mounting mechanism 3 in FIG. 3. FIGS. 16 and 17 are rear views showing the mounting mechanism 3 in FIG. 3.

The mounting mechanism 3 includes, as described above, eleven hands 14 through 24. The hands 14 through 24 are arranged in this order from an upper side to a lower side. The hands 14 through 24 are linearly moved in a horizontal direction when wafers 2 are conveyed. In the following descriptions, the "X" direction in FIG. 3 and the like which is a moving direction (reciprocation direction) of the hands 14 through 24 is defined as a "front and rear direction", and the "Y" direction in FIG. 3 and the like which is perpendicular to the upper and lower direction and the front and rear direction is defined as a "right and left direction". The right and left direction ("Y" direction) in this embodiment is an orthogonal direction which is perpendicular to the moving direction of the hands 14 through 24 and the upper and lower direction.

Further, in the following descriptions, for convenience of explanation, the "X1" direction side in FIG. 3 and the like which is one side in the front and rear direction is referred to as a "front" side, the "X2" direction side in FIG. 3 and the like which is its opposite side is referred to as a "rear" side, the "Y1" direction side in FIG. 3 and the like which is one side in the right and left direction is referred to as a "right" side, and the "Y2" direction side in FIG. 3 and the like which is its opposite side is referred to as a "left" side. In this embodiment, the front side is tip end sides of the hands 14 through 24 and the rear side is base end sides of the hands 14 through 24.

Each of the hands 14 through 24 includes a blade 36 on which a wafer 2 is mounted. As shown in FIG. 6, the hand 14 includes a blade holding member 37 to which the blade 36 is fixed, a fixing member 49 to which the blade holding member 37 is fixed, and bolts 61 having a head for fixing the blade holding member 37 to the fixing member 49. Similarly to the hand 14, the hand 15 includes a blade holding member 38 to which the blade 36 is fixed, a fixing member 50 to which the blade holding member 38 is fixed, and bolts 62 having a head for fixing the blade holding member 38 to the fixing member 50.

Similarly, the hand 16 includes a blade holding member 39 to which the blade 36 is fixed, a fixing member 51 to which the blade holding member 39 is fixed, and bolts 63 having a head for fixing the blade holding member 39 to the fixing member 51 (FIG. 6). The hand 17 includes a blade holding member 40 to which the blade 36 is fixed, a fixing member 52 to which the blade holding member 40 is fixed, and bolts 64 having a head for fixing the blade holding member 40 to the fixing member 52, and the hand 18 includes a blade holding member 41 to which the blade 36 is fixed, a fixing member 53 to which the blade holding member 41 is fixed, and bolts 65 having a head for fixing the blade holding member 41 to the fixing member 53 (see FIG. 7).

Further, the hand 19 includes a blade holding member 42 to which the blade 36 is fixed, a fixing member 54 to which the blade holding member 42 is fixed, and bolts 66 having a head for fixing the blade holding member 42 to the fixing member 54, and the hand 20 includes a blade holding member 43 to which the blade 36 is fixed, a fixing member 55 to which the blade holding member 43 is fixed, and bolts 67 having a head for fixing the blade holding member 43 to the fixing member 55 (see FIG. 8). The hand 21 includes a blade holding member 44 to which the blade 36 is fixed, a fixing member 56 to which the blade holding member 44 is fixed, and bolts 68 having a head for fixing the blade holding member 44 to the fixing member 56 (see FIG. 9).

In addition, the hand 22 includes a blade holding member 45 to which the blade 36 is fixed, a fixing member 57 to which the blade holding member 45 is fixed, and bolts 69 having a head for fixing the blade holding member 45 to the fixing member 57 (see FIG. 9). The hand 23 includes a blade holding member 46 to which the blade 36 is fixed, a fixing member 58 to which the blade holding member 46 is fixed, and bolts 70 having a head for fixing the blade holding member 46 to the fixing member 58 (see FIG. 10). The hand 24 includes a blade holding member 47 to which the blade 36 is fixed, a fixing member 59 to which the blade holding member 47 is fixed, and bolts 71 having a head for fixing the blade holding member 47 to the fixing member 59 (see FIG. 11).

In this embodiment, each of the blade holding members 37 through 47 and the blade 36 structure a mounting part for a wafer 2. Further, the blade 36 in this embodiment is a mounting part main body on which a wafer 2 is mounted, and each of the blade holding members 37 through 47 is a fixed part of the mounting part. Further, the fixing members 49 through 59 are fixing parts to which the blade holding members 37 through 47 which are the fixed parts are fixed. In this embodiment, similarly to the hands 14 through 24, the hand 4 includes a blade 73 on which a wafer 2 is mounted (see FIG. 2).

The blade 36 is formed in a flat plate shape. The blade 36 is arranged so that a thickness direction of the blade 36 and the upper and lower direction are coincided with each other. A shape of the blade 36 is a substantially "U"-shape when viewed in the upper and lower direction. The blades 36 are separately formed from the blade holding members 37 through 47.

Each of the blade holding members 37 through 47 is formed in a flat plate shape having a substantially rectangular shape. The blade holding members 37 through 47 are arranged so that the thickness directions of the blade holding members 37 through 47 and the upper and lower direction are coincided with each other. The hand 14 in this embodiment includes two blade holding members 37, and the two blade holding members 37 are disposed with a space therebetween in the right and left direction. Similarly, each of the hands 15 through 24 includes respectively two members of the blade holding members 38 through 47, and the two blade holding members in each of the blade holding members 38 through 47 are disposed with a space therebetween in the right and left direction.

The two blade holding members 37 are formed in the same shape as each other and, when viewed in the upper and lower direction, the two blade holding members 37 are line-symmetrically disposed with respect to a center in the right and left direction of the hand 14. Similarly, two blade holding members of each of the blade holding members 38 through 47 are formed in the same shape as each other and, when viewed in the upper and lower direction, the two blade holding members of each of the blade holding members 38 through 47 are line-symmetrically disposed with respect to respective centers in the right and left direction of the hands 15 through 24. Further, outer shapes of the blade holding members 37 through 47 are the same shape as each other.

A rear end part (base end part) of the blade 36 is fixed to front end parts of two blade holding members of each of the blade holding members 37 through 47 by a bolt such as a flat head bolt. The rear end part of the blade 36 is disposed on an upper side of the front end part of each of the blade holding members 37 through 47 and is fixed to each of the blade holding members 37 through 47 in an overlapped state with the front end part of each of the blade holding members 37 through 47 in the upper and lower direction. A lower face of the rear end part of the blade 36 is contacted with an upper face of the front end part of each of the blade holding members 37 through 47. The upper face of the front end part of each of the blade holding members 37 through 47 is slightly recessed toward a lower side.

Each of the fixing members 49 through 59 is formed in a flat plate shape. Each of the fixing members 49 through 59 is arranged so that a thickness direction of each of the fixing members 49 through 59 and the upper and lower direction are coincided with each other. Outer shapes of the fixing members 49 through 59 are formed in substantially the same shape as each other. The fixing members 49 through 59 are overlapped with each other at a predetermined pitch in the upper and lower direction. As described above, the hands 14 through 24 are arranged in this order from an upper side to a lower side, and the fixing members 49 through 59 are arranged in this order from the upper side to the lower side. The fixing members 50 through 59 disposed on the lower side with respect to the fixing member 49 are not viewed from the upper side with respect to the fixing member 49.

The blade holding member 37 is fixed to a front end part of the fixing member 49 by the bolts 61 which are disposed with the upper and lower direction as an axial direction. The blade holding member 37 is fixed to the fixing member 49 in an overlapped state with the fixing member 49 in the upper and lower direction. Specifically, the blade holding member 37 is disposed on an upper side of the front end part of the fixing member 49 and is fixed to the fixing member 49 in an overlapped state with the front end part of the fixing member 49. A lower face of the blade holding member 37 is contacted with an upper face of the front end part of the fixing member 49. The upper face of the front end part of the fixing member 49 is slightly recessed toward a lower side. In this embodiment, a shim for height adjustment may be provided between the lower face of the blade holding member 37 and the upper face of the front end part of the fixing member 49.

Similarly, the blade holding member 38 is fixed to a front end part of the fixing member 50 by the bolts 62 which are disposed with the upper and lower direction as an axial direction, and the blade holding member 39 is fixed to a front end part of the fixing member 51 by the bolts 63 which are disposed with the upper and lower direction as an axial direction. The blade holding member 40 is fixed to a front end part of the fixing member 52 by the bolts 64 which are disposed with the upper and lower direction as an axial direction, the blade holding member 41 is fixed to a front end part of the fixing member 53 by the bolts 65 which are disposed with the upper and lower direction as an axial direction, and the blade holding member 42 is fixed to a front end part of the fixing member 54 by the bolts 66 which are disposed with the upper and lower direction as an axial direction.

Further, the blade holding member 43 is fixed to a front end part of the fixing member 55 by the bolts 67 which are disposed with the upper and lower direction as an axial direction, the blade holding member 44 is fixed to a front end part of the fixing member 56 by the bolts 68 which are disposed with the upper and lower direction as an axial direction, and the blade holding member 45 is fixed to a front end part of the fixing member 57 by the bolts 69 which are disposed with the upper and lower direction as an axial direction. The blade holding member 46 is fixed to a front end part of the fixing member 58 by the bolts 70 which are disposed with the upper and lower direction as an axial direction, and the blade holding member 47 is fixed to a front end part of the fixing member 59 by the bolts 71 which are disposed with the upper and lower direction as an axial direction.

Each of the blade holding members 38 through 47 is disposed on the upper side of each of the front end parts of the fixing members 50 through 59 and is fixed to each of the fixing members 50 through 59 in an overlapped state with each of the front end parts of the fixing members 50 through 59 in the upper and lower direction. Each of the lower faces of the blade holding members 38 through 47 is contacted with each of the upper faces of the front end parts of the fixing members 50 through 59. The upper face of each of the front end parts of the fixing members 50 through 59 is slightly recessed toward a lower side. In this embodiment, a shim for height adjustment may be provided between the lower face of each of the blade holding members 38 through 47 and the upper face of each of the front end parts of the fixing members 50 through 59.

Most portions of the fixing members 49 through 59 except the front end parts of the fixing members 49 through 59 to which the blade holding members 37 through 47 are fixed are disposed between a lower frame 75 structuring a lower face of the mounting mechanism 3 and an upper frame 76 structuring an upper face of the mounting mechanism 3 (see FIGS. 15 through 17). The lower frame 75 is fixed to a movable part of the linear drive mechanism 5. An upper face of the lower frame 75 is fixed with a plurality of support columns which are stood up toward an upper side, and the upper frame 76 is fixed to upper end parts of the plurality of the support columns. In FIGS. 3 and 4 and the like, the upper frame 76 is not shown.

The bolt 61 is a bolt with a hexagonal hole whose head part 61a is formed with a hexagonal recessed part. Similarly, the bolts 62 through 71 are bolts with a hexagonal hole whose head parts 62a through 71a are formed with a hexagonal recessed part. The head part 61a of the bolt 61 is disposed on an upper side of a shaft part of the bolt 61. The head parts 62a through 71a of the bolts 62 through 71 are disposed on lower sides of shaft parts of the bolts 62 through 71. The bolts 62 through 71 in this embodiment are upward bolts which are bolts whose head parts 62a through 71a are disposed on a lower side, and the bolt 61 is a downward bolt which is a bolt whose head part 61a is disposed on an upper side.

In other words, in this embodiment, the bolt 61 provided in the hand 14 which is disposed uppermost is a downward bolt. Further, the bolts 62 through 71 provided in the remaining hands 15 through 24 except the hand 14 which is disposed uppermost among the eleven hands 14 through 24 are upward bolts. The hands 15 through 23 in this embodiment are first hands which are hands having the upward bolts and hands except the hand 14 disposed uppermost and the hand 24 disposed at the bottom of the eleven hands 14 through 24.

As shown in FIG. 3, the blade holding members 37 are fixed to the fixing member 49 by four bolts 61. Specifically, one of the two blade holding members 37 is fixed to the fixing member 49 by two bolts 61, and the other of the two blade holding members 37 is fixed to the fixing member 49 by two bolts 61. Two bolts 61 which fix one of the blade holding members 37 are disposed on one side in the right and left direction with respect to a center in the right and left direction of the hand 14, and two bolts 61 which fix the other of the blade holding members 37 are disposed on the other side in the right and left direction with respect to the center in the right and left direction of the hand 14. In other words, the blade holding members 37 are fixed to the fixing member 49 by the bolts 61 which are disposed on both sides in the right and left direction with respect to the center in the right and left direction of the hand 14.

Similarly, the respective blade holding members 38 through 47 are fixed to the respective fixing members 50 through 59 by four bolts of the respective bolts 62 through 71. Further, the respective blade holding members 38 through 47 are fixed to the respective fixing members 50 through 59 by the respective bolts 62 through 71 which are disposed on both sides in the right and left direction with respect to the respective centers in the right and left direction of the hands 15 through 24.

Two bolts 61 disposed on one side in the right and left direction are disposed with a space therebetween in the front and rear direction. Two bolts 61 disposed on the other side in the right and left direction are also disposed with a space therebetween in the front and rear direction. The two bolts 61 disposed on one side in the right and left direction and the two bolts 61 disposed on the other side in the right and left direction are disposed at the same position as each other in the front and rear direction.

Similarly, two bolts 62 disposed on one side in the right and left direction are disposed with a space therebetween in the front and rear direction. Two bolts 62 disposed on the other side in the right and left direction are disposed with a space therebetween in the front and rear direction. The two bolts 62 disposed on one side in the right and left direction and the two bolts 62 disposed on the other side in the right and left direction are disposed at the same position as each other in the front and rear direction.

Similarly, two bolts of the respective bolts 63 through 71 disposed on one side in the right and left direction are disposed with a space therebetween in the front and rear direction, and two bolts of the respective bolts 63 through 71 disposed on the other side in the right and left direction are disposed with a space therebetween in the front and rear direction. Further, similarly, the two bolts of the respective bolts 63 through 71 disposed on one side in the right and left direction and the two bolts of the respective bolts 63 through 71 disposed on the other side in the right and left direction are disposed at the same position as each other in the front and rear direction.

In both sides in the right and left direction, the two bolts 61 are disposed on outer side end parts in the right and left direction of the blade holding members 37 (see FIG. 3). In both sides in the right and left direction, two bolts 61 and two bolts 62 are disposed at the same position in the right and left direction and in the front and rear direction, and the two bolts 62 are disposed directly under the two bolts 61. In both sides in the right and left direction, two bolts 62 and two bolts 63 are disposed at the same position in the right and left direction and are disposed at positions shifted from each other in the front and rear direction. The bolts 62 and the bolts 63 are alternately disposed in this order from a rear side to a front side.

Further, in both sides in the right and left direction, two bolts 64 and two bolts 65 are disposed at the same position in the right and left direction and are disposed at positions shifted from each other in the front and rear direction. The bolts 64 and the bolts 65 are alternately disposed in this order from the rear side to the front side. The bolts 64 and 65 are disposed on an inner side in the right and left direction with respect to the bolts 62 and 63. Further, in both sides in the right and left direction, two bolts 66 and two bolts 67 are disposed at the same position in the right and left direction and are disposed at positions shifted from each other in the front and rear direction. The bolts 66 and the bolts 67 are alternately disposed in this order from the rear side to the front side. The bolts 66 and 67 are disposed on an inner side in the right and left direction with respect to the bolts 64 and 65.

Further, in both sides in the right and left direction, two bolts 68 and two bolts 69 are disposed at the same position in the right and left direction and are disposed at positions shifted from each other in the front and rear direction. The bolts 68 and the bolts 69 are alternately disposed in this order from the rear side to the front side. The bolts 68 and 69 are disposed on an inner side in the right and left direction with respect to the bolts 66 and 67. The bolts 70 are disposed on an inner side in the right and left direction with respect to the bolts 68 and 69. The bolts 71 are disposed on an inner side in the right and left direction with respect to the bolts 70.

As described above, the bolt 61 and the bolt 62 are disposed at the same position in a horizontal direction, but each of the bolts 62 through 71 is disposed at a position shifted from each other in the horizontal direction. In other words, when viewed in the upper and lower direction, the bolt 61 and the bolt 62 are overlapped with each other, but each of the bolts 62 through 71 is disposed at the position shifted from each other and the bolts 62 through 71 are not overlapped with each other.

Further, the bolts 64 and 65 are disposed on the inner side in the right and left direction with respect to the bolts 62 and 63, the bolts 66 and 67 are disposed on the inner side in the right and left direction with respect to the bolts 64 and 65, the bolts 68 and 69 are disposed on the inner side in the right and left direction with respect to the bolts 66 and 67, the bolt 70 is disposed on the inner side in the right and left direction with respect to the bolts 68 and 69, and the bolt 71 is disposed on the inner side in the right and left direction with respect to the bolt 70. In other words, the bolts 62 through 71 provided in the remaining hands 15 through 24 except the hand 14 which is disposed uppermost among the plurality of the hands 14 through 24 are successively shifted toward the inner side in the right and left direction from the hand 15 disposed on the upper side toward the hand 24 disposed on the lower side. Further, in this embodiment, in the front and rear direction, the bolt 62, the bolt 64, the bolt 66, the bolt 68, the bolt 70 and the bolt 71 are disposed at the same position, and the bolt 63, the bolt 65, the bolt 67 and the bolt 69 are disposed at the same position.

As shown in FIG. 6, the blade holding member 37 is formed with an arrangement hole 37a in which a head part 61a and the like of the bolt 61 are arranged. The fixing member 49 is formed with a screw hole with which a male screw of the bolt 61 is engaged. The bolt 61 is screwed into the fixing member 49 from an upper side. In this embodiment, the bolt 61 is disposed at a position where the bolt 61 is not covered by the hand 4 from an upper side even when the hand 4 and the hand 14 are overlapped with each other.

The blade holding member 38 is formed with a screw hole with which a male screw of the bolt 62 is engaged. Similarly, each of the blade holding members 39 through 47 is formed with a screw hole with which a male screw of each of the bolts 63 through 71 is engaged. The fixing member 50 is formed with an arrangement hole 50a in which a head part 62a and the like of the bolt 62 are arranged. Similarly, the respective fixing members 51 through 59 are formed with arrangement holes 51a through 59a in which the respective head parts 63a through 71a and the like of the respective bolts 63 through 71 are arranged (see FIG. 6 through FIG. 11). Each of the bolts 62 through 71 is screwed into each of the blade holding members 38 through 47 from a lower side.

As shown in FIG. 6, each of the blade holding members 39 through 47 and each of the fixing members 51 through 59 which are disposed on a lower side with respect to the bolt 62 are formed with through holes "h1" for engaging a tool "T" with the head part 62a of the bolt 62 from a lower side with respect to the fixing member 59. In other words, the blade holding members 39 through 47 and the fixing members 51 through 59 of all the hands 16 through 24 which are disposed on the lower side with respect to the bolt 62 are formed with the through holes "h1" for engaging the tool "T" with the head part 62a from the lower side with respect to the hand 24 disposed at the bottom. The through holes "h1" are formed directly under the head part 62a.

Further, each of the blade holding members 40 through 47 and each of the fixing members 52 through 59 which are disposed on a lower side with respect to the bolt 63 are formed with through holes "h2" for engaging a tool "T" with the head part 63a of the bolt 63 from a lower side with respect to the fixing member 59. In other words, the blade holding members 40 through 47 and the fixing members 52 through 59 of all the hands 17 through 24 which are disposed on the lower side with respect to the bolt 63 are formed with the through holes "h2" for engaging the tool "T" with the head part 63a from the lower side with respect to the hand 24 disposed at the bottom. The through holes "h2" are formed directly under the head part 63a.

As shown in FIG. 7, each of the blade holding members 41 through 47 and each of the fixing members 53 through 59 which are disposed on a lower side with respect to the bolt 64 are formed with through holes "h3" for engaging a tool "T" with the head part 64a of the bolt 64 from the lower side with respect to the fixing member 59. In other words, the blade holding members 41 through 47 and the fixing members 53 through 59 of all the hands 18 through 24 which are disposed on the lower side with respect to the bolt 64 are formed with the through holes "h3" for engaging the tool "T" with the head part 64a from the lower side with respect to the hand 24 disposed at the bottom. The through holes "h3" are formed directly under the head part 64a.

Further, each of the blade holding members 42 through 47 and each of the fixing members 54 through 59 which are disposed on a lower side with respect to the bolt 65 are formed with through holes "h4" for engaging a tool "T" with the head part 65a of the bolt 65 from the lower side with respect to the fixing member 59. In other words, the blade holding members 42 through 47 and the fixing members 54 through 59 of all the hands 19 through 24 which are disposed on the lower side with respect to the bolt 65 are formed with the through holes "h4" for engaging the tool "T" with the head part 65a from the lower side with respect to the hand 24 disposed at the bottom. The through holes "h4" are formed directly under the head part 65a.

As shown in FIG. 8, each of the blade holding members 43 through 47 and each of the fixing members 55 through 59 which are disposed on a lower side with respect to the bolt 66 are formed with through holes "h5" for engaging a tool "T" with the head part 66a of the bolt 66 from the lower side with respect to the fixing member 59. In other words, the blade holding members 43 through 47 and the fixing members 55 through 59 of all the hands 20 through 24 which are disposed on the lower side with respect to the bolt 66 are formed with the through holes "h5" for engaging the tool "T" with the head part 66a from the lower side with respect to the hand 24 disposed at the bottom. The through holes "h5" are formed directly under the head part 66a.

Further, each of the blade holding members 44 through 47 and each of the fixing members 56 through 59 which are disposed on a lower side with respect to the bolt 67 are formed with through holes "h6" for engaging a tool "T" with the head part 67a of the bolt 67 from the lower side with respect to the fixing member 59. In other words, the blade holding members 44 through 47 and the fixing members 56 through 59 of all the hands 21 through 24 which are disposed on the lower side with respect to the bolt 67 are formed with the through holes "h6" for engaging the tool "T" with the head part 67a from the lower side with respect to the hand 24 disposed at the bottom. The through holes "h6" are formed directly under the head part 67a.

As shown in FIG. 9, each of the blade holding members 45 through 47 and each of the fixing members 57 through 59 which are disposed on a lower side with respect to the bolt 68 are formed with through holes "h7" for engaging a tool "T" with the head part 68a of the bolt 68 from the lower side with respect to the fixing member 59. In other words, the blade holding members 45 through 47 and the fixing members 57 through 59 of all the hands 22 through 24 which are disposed on the lower side with respect to the bolt 68 are formed with the through holes "h7" for engaging the tool "T" with the head part 68a from the lower side with respect to the hand 24 disposed at the bottom. The through holes "h7" are formed directly under the head part 68a.

Further, the blade holding members 46 and 47 and the fixing members 58 and 59 which are disposed on a lower side with respect to the bolt 69 are formed with through holes "h8" for engaging a tool "T" with the head part 69a of the bolt 69 from the lower side with respect to the fixing member 59. In other words, the blade holding members 46 and 47 and the fixing members 58 and 59 of all the hands 23 and 24 which are disposed on the lower side with respect to the bolt 69 are formed with the through holes "h8" for engaging the tool "T" with the head part 69a from the lower side with respect to the hand 24 disposed at the bottom. The through holes "h8" are formed directly under the head part 69a.

As shown in FIG. 10, the blade holding member 47 and the fixing member 59 which are disposed on a lower side with respect to the bolt 70 are formed with through holes "h9" for engaging a tool "T" with the head part 70a of the bolt 70 from the lower side with respect to the fixing member 59. In other words, the blade holding member 47 and the fixing member 59 of the hand 24 which are disposed on the lower side with respect to the bolt 70 are formed with the through holes "h9" for engaging the tool "T" with the head part 70a from the lower side with respect to the hand 24 disposed at the bottom. The through holes "h9" are formed directly under the head part 70a.

As described above, the blade holding member 39 and the fixing member 51 are formed with the through holes "h1", the blade holding member 40 and the fixing member 52 are formed with the through holes "h1" and "h2", the blade holding member 41 and the fixing member 53 are formed with the through holes "h1" through "h3" (see FIG. 13), the blade holding member 42 and the fixing member 54 are formed with the through holes "h1" through "h4", and the blade holding member 43 and the fixing member 55 are formed with the through holes "h1" through "h5". Further, the blade holding member 44 and the fixing member 56 are formed with the through holes "h1" through "h6", the blade holding member 45 and the fixing member 57 are formed with the through holes "h1" through "h7", the blade holding member 46 and the fixing member 58 are formed with the through holes "h1" through "h8", and the blade holding member 47 and the fixing member 59 are formed with the through holes "h1" through "h9" (see FIG. 14).

The through holes "h1" through "h9" are circular holes penetrating through in the upper and lower direction. Inside diameters of the through holes "h1" through "h9" are set to be larger than outside diameters of the head parts 62a through 70a of the bolts 62 through 70. The tool "T" is a "T"-wrench. A tip end part of the tool "T" is formed with an engaging part in a hexagonal prism shape which is capable of engaging with a recessed part of each of the head parts 62a through 70a.

The fixing member 49 is fixed with a support member 78 having a support part 78a for supporting the fixing member 50 from a lower side. In other words, the hand 14 is provided with the support part 78a for supporting the hand 15 from a lower side. In this embodiment, the support member 78 is fixed to the fixing member 49 on both sides in the right and left direction, and the fixing member 50 can be supported by two support parts 78a from a lower side on both sides in the right and left direction.

Similarly, support members 79 having a support part 79a for supporting the fixing member 51 from a lower side on both sides in the right and left direction are fixed to both end sides in the right and left direction of the fixing member 50, and support members 80 having a support part 80a for supporting the fixing member 52 from a lower side on both sides in the right and left direction are fixed to both end sides in the right and left direction of the fixing member 51. Further, support members 81 having a support part 81a for supporting the fixing member 53 from a lower side on both sides in the right and left direction are fixed to both end sides in the right and left direction of the fixing member 52, and support members 82 having a support part 82a for supporting the fixing member 54 from a lower side on both sides in the right and left direction are fixed to both end sides in the right and left direction of the fixing member 53.

Further, support members 83 having a support part 83a for supporting the fixing member 55 from a lower side on both sides in the right and left direction are fixed to both end sides in the right and left direction of the fixing member 54, and support members 84 having a support part 84a for supporting the fixing member 56 from a lower side on both sides in the right and left direction are fixed to both end sides in the right and left direction of the fixing member 55. Further, support members 85 having a support part 85a for supporting the fixing member 57 from a lower side on both sides in the right and left direction are fixed to both end sides in the right and left direction of the fixing member 56, support members 86 having a support part 86a for supporting the fixing member 58 from a lower side on both sides in the right and left direction are fixed to both end sides in the right and left direction of the fixing member 57, and support members 87 having a support part 87a for supporting the fixing member 59 from a lower side on both sides in the right and left direction are fixed to both end sides in the right and left direction of the fixing member 58.

In other words, each of the hands 15 through 23 is provided with each of two support parts 79a through two support parts 87a for supporting each of the hands 16 through 24 from a lower side. Each of the support parts 78a through 87a is formed in a flat plate shape. The support parts 78a through 87a are disposed so that a thickness direction of each of the support parts 78a through 87a and the upper and lower direction are coincided with each other. Lower faces of both end side portions in the right and left direction of the fixing members 50 through 59 are formed with recessed parts 50b through 59b in which the respective support parts 78a through 87a are disposed.

The recessed parts 50b through 59b are recessed from respective lower faces of the fixing members 50 through 59 to an upper side and, in addition, from both end faces in the right and left direction of the fixing members 50 through 59 to an inner side in the right and left direction. Upper faces of the recessed parts 50b through 59b are flat faces perpendicular to the upper and lower direction. A thickness (thickness in the upper and lower direction) of each of the support parts 78a through 87a is set to be thinner than a width in the upper and lower direction of each of the recessed parts 50b through 59b. A position in the upper and lower direction of each of the support members 79 through 87 is capable of being adjusted by a bolt 88 for adjustment with respect to each of the fixing members 49 through 58.

Further, the upper frame 76 of the mounting mechanism 3 is fixed with support members 89 having a support part 89a for supporting the fixing member 49 from a lower side on both sides in the right and left direction. The support part 89a is formed in a flat plate shape and is disposed so that a thickness direction of the support part 89a and the upper and lower direction are coincided with each other. The support member 89 is shown in FIG. 15.

Lower faces of both end side portions in the right and left direction of the fixing member 49 are formed with recessed parts 49b in which the support parts 89a are disposed. Similarly to the recessed parts 50b through 59b, the recessed part 49b is recessed from the lower face of the fixing member 49 toward an upper side and, in addition, from both end faces in the right and left direction of the fixing member 49 toward an inner side in the right and left direction. An upper face of the recessed part 49b is a flat face perpendicular to the upper and lower direction. A thickness (thickness in the upper and lower direction) of the support part 89a is set to be thinner than a width in the upper and lower direction of the recessed part 49b. A position in the upper and lower direction of the support member 89 with respect to the upper frame 76 is capable of being adjusted by a bolt for adjustment.

(Structure of Pitch Change Mechanism)

A pitch change mechanism 25 changes a pitch in the upper and lower direction of the eleven blades 36. In other words, the pitch change mechanism 25 changes a pitch in the upper and lower direction of mounting parts of the eleven hands 14 through 24. Specifically, the pitch change mechanism 25 sets a pitch in the upper and lower direction of the eleven blades 36 to a predetermined first pitch (see FIG. 17) and a second pitch (see FIG. 16) which is wider than the first pitch. The first pitch is, for example, about 8 mm, and the second pitch is, for example, about 10 mm. The pitch change mechanism 25 includes a lifting mechanism 91 which moves the hand 24 up and down and a guide mechanism 92 which linearly guides the hands 14 through 24 in the upper and lower direction.

The lifting mechanism 91 includes an air cylinder 93 as a drive source and a connection member 94 which connects the air cylinder 93 with the hand 24. The air cylinder 93 is a low speed air cylinder whose a rod (piston) is moved comparatively slow. The air cylinder 93 is fixed to an upper face side of the lower frame 75. The air cylinder 93 is disposed so that the rod of the air cylinder 93 is protruded toward a lower side. The connection member 94 is fixed to a lower end part of the rod of the air cylinder 93 and a lower face of the fixing member 59 of the hand 24.

The guide mechanism 92 is a ball spline mechanism which includes a plurality of spline shafts 95 through 98 and a plurality of outer cylinders 99 through which the spline shafts 95 through 98 are inserted. The guide mechanism 92 in this embodiment includes four spline shafts 95 through 98 and twenty-two outer cylinders 99. The spline shafts 95 through 98 are disposed so that axial directions of the spline shafts 95 through 98 and the upper and lower direction are coincided with each other. Lower ends of the spline shafts 95 through 98 are fixed to the lower frame 75, and upper ends of the spline shafts 95 through 98 are fixed to the upper frame 76. The outer cylinder 99 is formed in a cylindrical tube shape. The outer cylinder 99 is fixed to each of the hands 14 through 24. Specifically, two outer cylinders 99 are respectively fixed to each of the fixing members 49 through 59.

In this embodiment, when a pitch of the eleven blades 36 is the first pitch, the rod of the air cylinder 93 is retracted to set a state that the hand 24 is pushed up. In this case, as shown in FIG. 17, an upper face of the fixing member 49 is contacted with a lower face of the upper frame 76, an upper face of the fixing member 50 is contacted with a lower face of the fixing member 49, an upper face of the fixing member 51 is contacted with a lower face of the fixing member 50, an upper face of the fixing member 52 is contacted with a lower face of the fixing member 51, an upper face of the fixing member 53 is contacted with a lower face of the fixing member 52, an upper face of the fixing member 54 is contacted with a lower face of the fixing member 53, an upper face of the fixing member 55 is contacted with a lower face of the fixing member 54, an upper face of the fixing member 56 is contacted with a lower face of the fixing member 55, an upper face of the fixing member 57 is contacted with a lower face of the fixing member 56, an upper face of the fixing member 58 is contacted with a lower face of the fixing member 57, and an upper face of the fixing member 59 is contacted with a lower face of the fixing member 58.

Further, in the case that the pitch of the eleven blades 36 is the first pitch, in the upper and lower direction, a space is formed between the fixing member 49 and an upper face of the support part 89a, a space is formed between the fixing member 50 and an upper face of the support part 78a, a space is formed between the fixing member 51 and an upper face of the support part 79a, a space is formed between the fixing member 52 and an upper face of the support part 80a, a space is formed between the fixing member 53 and an upper face of the support part 81a, a space is formed between the fixing member 54 and an upper face of the support part 82a, a space is formed between the fixing member 55 and an upper face of the support part 83a, a space is formed between the fixing member 56 and an upper face of the support part 84a, a space is formed between the fixing member 57 and an upper face of the support part 85a, a space is formed between the fixing member 58 and an upper face of the support part 86a, and a space is formed between the fixing member 59 and an upper face of the support part 87a.

Further, in the case that the pitch of the eleven blades 36 is the first pitch, in the upper and lower direction, a space is formed between the fixing member 50 and a lower face of the support part 89a, a space is formed between the fixing member 51 and a lower face of the support part 78a, a space is formed between the fixing member 52 and a lower face of the support part 79a, a space is formed between the fixing member 53 and a lower face of the support part 80a, a space is formed between the fixing member 54 and a lower face of the support part 81a, a space is formed between the fixing member 55 and a lower face of the support part 82a, a space is formed between the fixing member 56 and a lower face of the support part 83a, a space is formed between the fixing member 57 and a lower face of the support part 84a, a space is formed between the fixing member 58 and a lower face of the support part 85a, and a space is formed between the fixing member 59 and a lower face of the support part 86a.

On the other hand, in a case that the pitch of the eleven blades 36 is to be the second pitch, the rod of the air cylinder 93 is protruded to be set in a state that the hand 24 is lowered. In this case, as shown in FIG. 16, the fixing member 49 is contacted with the upper face of the support part 89a, the fixing member 50 is contacted with the upper face of the support part 78a, the fixing member 51 is contacted with the upper face of the support part 79a, the fixing member 52 is contacted with the upper face of the support part 80a, the fixing member 53 is contacted with the upper face of the support part 81a, the fixing member 54 is contacted with the upper face of the support part 82a, the fixing member 55 is contacted with the upper face of the support part 83a, the fixing member 56 is contacted with the upper face of the support part 84a, the fixing member 57 is contacted with the upper face of the support part 85a, the fixing member 58 is contacted with the upper face of the support part 86a, and the fixing member 59 is contacted with the upper face of the support part 87a.

Further, in the case that the pitch of the eleven blades 36 is the second pitch, in the upper and lower direction, a space is formed between the upper face of the fixing member 49 and the lower face of the upper frame 76, a space is formed between the upper face of the fixing member 50 and the lower face of the fixing member 49, a space is formed between the upper face of the fixing member 51 and the lower face of the fixing member 50, a space is formed between the upper face of the fixing member 52 and the lower face of the fixing member 51, a space is formed between the upper face of the fixing member 53 and the lower face of the fixing member 52, a space is formed between the upper face of the fixing member 54 and the lower face of the fixing member 53, a space is formed between the upper face of the fixing member 55 and the lower face of the fixing member 54, a space is formed between the upper face of the fixing member 56 and the lower face of the fixing member 55, a space is formed between the upper face of the fixing member 57 and the lower face of the fixing member 56, a space is formed between the upper face of the fixing member 58 and the lower face of the fixing member 57, and a space is formed between the upper face of the fixing member 59 and the lower face of the fixing member 58.

In the state that the pitch of the eleven blades 36 is set to the second pitch, when the lifting mechanism 91 raises the hand 24 (specifically, when the air cylinder 93 raises the hand 24), the upper face of the fixing member 59 is contacted with the lower face of the fixing member 58 to lift up the fixing member 58, the upper face of the fixing member 58 is contacted with the lower face of the fixing member 57 to lift up the fixing member 57, the upper face of the fixing member 57 is contacted with the lower face of the fixing member 56 to lift up the fixing member 56, the upper face of the fixing member 56 is contacted with the lower face of the fixing member 55 to lift up the fixing member 55, the upper face of the fixing member 55 is contacted with the lower face of the fixing member 54 to lift up the fixing member 54, the upper face of the fixing member 54 is contacted with the lower face of the fixing member 53 to lift up the fixing member 53, the upper face of the fixing member 53 is contacted with the lower face of the fixing member 52 to lift up the fixing member 52, the upper face of the fixing member 52 is contacted with the lower face of the fixing member 51 to lift up the fixing member 51, the upper face of the fixing member 51 is contacted with the lower face of the fixing member 50 to lift up the fixing member 50, and the upper face of the fixing member 50 is contacted with the lower face of the fixing member 49 to lift up the fixing member 49. As a result, the pitch of the eleven blades 36 is set to the first pitch.

As described above, in the state that the pitch of the eleven blades 36 is the second pitch, when the lifting mechanism 91 raises the hand 24, the upper faces of the hands 24 through 15 are successively contacted with the lower faces of the hands 23 through 14 to lift up the hands 23 through 14 in this order and, as a result, the pitch of the eleven blades 36 is set to the first pitch. In other words, in the state that the pitch of the eleven blades 36 is the second pitch, when the lifting mechanism 91 raises the hand 24, the hands 14 through 23 are lifted up accompanied by a lift of the hand 24 and, as a result, the pitch in the upper and lower direction of the eleven blades 36 is set to the first pitch.

On the other hand, in the state that the pitch of the eleven blades 36 is the first pitch, when the lifting mechanism 91 lowers the hand 24 (specifically, when the hand 24 is lowered by the air cylinder 93), the fixing member 59 contacts with the upper face of the support part 87a to lower the fixing member 58, the fixing member 58 contacts with the upper face of the support part 86a to lower the fixing member 57, the fixing member 57 contacts with the upper face of the support part 85a to lower the fixing member 56, the fixing member 56 contacts with the upper face of the support part 84a to lower the fixing member 55, the fixing member 55 contacts with the upper face of the support part 83a to lower the fixing member 54, the fixing member 54 contacts with the upper face of the support part 82a to lower the fixing member 53, the fixing member 53 contacts with the upper face of the support part 81a to lower the fixing member 52, the fixing member 52 contacts with the upper face of the support part 80a to lower the fixing member 51, the fixing member 51 contacts with the upper face of the support part 79a to lower the fixing member 50, and the fixing member 50 contacts with the upper face of the support part 78a to lower the fixing member 49. As a result, the pitch of the eleven blades 36 is set to the second pitch.

As described above, in the state that the pitch of the eleven blades 36 is the first pitch, when the lifting mechanism 91 lowers the hand 24, the hands 24 through 15 successively contact with the upper faces of the support parts 87a through 78a to successively lower the hands 23 through 14 in this order and, as a result, the pitch of the eleven blades 36 is set to the second pitch. In other words, in the state that the pitch of the eleven blades 36 is the first pitch, when the hand 24 is lowered by the lifting mechanism 91, the hands 14 through 23 are lowered accompanied by lowering of the hand 24 and, as a result, the pitch in the upper and lower direction of the eleven blades 36 is set to the second pitch.

(Principal Effects in this Embodiment)

As described above, in this embodiment, the blade holding members 39 through 47 and the fixing members 51 through 59 are formed with the through holes "h1" for engaging a tool "T" with the head part 62a of the bolt 62 from a lower side with respect to the hand 24 disposed at the bottom. Further, in this embodiment, the blade holding members 40 through 47 and the fixing members 52 through 59 are formed with the through holes "h2" for engaging a tool "T" with the head part 63a of the bolt 63 from the lower side with respect to the hand 24, the blade holding members 41 through 47 and the fixing members 53 through 59 are formed with the through holes "h3" for engaging a tool "T" with the head part 64a of the bolt 64 from the lower side with respect to the hand 24, and the blade holding members 42 through 47 and the fixing members 54 through 59 are formed with the through holes "h4" for engaging a tool "T" with the head part 65a of the bolt 65 from the lower side with respect to the hand 24.

In addition, in this embodiment, the blade holding members 43 through 47 and the fixing members 55 through 59 are formed with the through holes "h5" for engaging a tool "T" with the head part 66a of the bolt 66 from the lower side with respect to the hand 24, the blade holding members 44 through 47 and the fixing members 56 through 59 are formed with the through holes "h6" for engaging a tool "T" with the head part 67a of the bolt 67 from the lower side with respect to the hand 24, the blade holding members 45 through 47 and the fixing members 57 through 59 are formed with the through holes "h7" for engaging a tool "T" with the head part 68a of the bolt 68 from the lower side with respect to the hand 24, the blade holding members 46 and 47 and the fixing members 58 and 59 are formed with the through holes "h8" for engaging a tool "T" with the head part 69a of the bolt 69 from the lower side with respect to the hand 24, and the blade holding member 47 and the fixing member 59 are formed with the through holes "h9" for engaging a tool "T" with the head part 70a of the bolt 70 from the lower side with respect to the hand 24. Further, in this embodiment, inside diameters of the through holes "h1" through "h9" are set to be larger than outside diameters of the head parts 62a through 70a of the bolts 62 through 70.

Therefore, in this embodiment, even when the fixing members 49 through 59 are overlapped with each other in the upper and lower direction and, even in the state that the blade holding members 38 through 46 are fixed to the fixing members 50 through 58, the bolts 62 through 70 can be attached and detached by using a tool "T" from a lower side with respect to the hand 24 which is disposed at the bottom. Further, in this embodiment, the bolt 61 is screwed into the fixing member 49 from an upper side and thus, the bolt 61 can be attached and detached from an upper side of the hand 14 which is disposed uppermost, and the bolt 71 is screwed into the blade holding member 47 from a lower side and thus, the bolt 71 can be attached and detached from a lower side of the hand 24.

Accordingly, in this embodiment, even when the fixing members 49 through 59 are overlapped with each other in the upper and lower direction, an arbitrary one or more of the blade holding members 37 through 47 can be individually attached to and detached from the fixing members 49 through 59 together with their blades 36 without detaching other blade holding members 37 through 47 from the fixing members 49 through 59. Further, in this embodiment, the fixing members 49 through 59 are overlapped with each other in the upper and lower direction and thus, a size of a base end side portion (rear end side portion) of the mounting mechanism 3 can be reduced. In other words, in this embodiment, although an arbitrary one or more of the blade holding members 37 through 47 can be individually attached to and detached from the fixing members 49 through 59 together with their blades 36 without detaching other blade holding members 37 through 47 from the fixing members 49 through 59, a size of the base end side portion of the mounting mechanism 3 can be reduced.

In this embodiment, the bolts 62 through 70 are upward bolts whose head parts 62a through 70a are disposed on a lower side. Therefore, in this embodiment, the bolts 62 through 70 loosened by a tool "T" can be dropped to a lower side with respect to the hand 24 disposed at the bottom by their own weights. Accordingly, in this embodiment, even when the fixing members 49 through 59 are overlapped with each other in the upper and lower direction, the bolts 62 through 70 can be detached easily and, as a result, detaching operations of the bolts 62 through 70 can be easily performed.

In this embodiment, the bolts 62 through 71 are successively shifted toward an inner side in the right and left direction from the hand 15 disposed on an upper side toward the hand 24 disposed on a lower side. Therefore, in this embodiment, even when the fixing members 49 through 59 are overlapped with each other in the upper and lower direction and the positions of the bolts 62 through 70 may be hard to be visually confirmed, the positions in a horizontal direction of the bolts 62 through 70 are easily grasped.

In this embodiment, shapes of the blade holding members 37 through 47 are required to be changed for each of the hands 14 through 24 due to the arrangement hole 37a formed in the blade holding member 37, positions of screw holes and the number of the through holes "h1" through "h9" formed in the blade holding members 38 through 47. However, in this embodiment, a shape of the blade 36 which is separately formed from each of the blade holding members 37 through 47 is common to all the hands 14 through 24. Therefore, in this embodiment, a component cost of each of the hands 14 through 24 can be reduced.

OTHER EMBODIMENTS

Although the present invention has been shown and described with reference to a specific embodiment, various changes and modifications will be apparent to those skilled in the art from the teachings herein.

In the embodiment described above, the head part 61a of the bolt 61 may be disposed on a lower side of the shaft part of the bolt 61. In this case, an arrangement hole in which a head part 61a and the like of the bolt 61 are disposed is formed in the fixing member 49, and a screw hole with which a male screw of the bolt 61 is engaged is formed in the blade holding member 37. Further, in this case, the bolt 61 and the bolt 62 are disposed at positions shifted to each other in at least one of the right and left direction and the front and rear direction. In other words, the bolt 61 and the bolt 62 are disposed at positions shifted to each other in the horizontal direction. Further, in this case, all of the blade holding members 38 through 47 and all of the fixing members 50 through 59, which are disposed on a lower side with respect to the bolt 61, are formed with through holes for engaging a tool "T" with the head part 61a from a lower side with respect to the fixing member 59.

In the embodiment described above, when bolts 62 through 70 having been loosened are capable of being detached, the bolts 62 through 70 may include downward bolts whose head parts 62a through 70a are disposed on an upper side of their shaft parts. In this case, all of the blade holding members 37 through 45 and all of the fixing members 49 through 57, which are disposed on an upper side with respect to the downward bolt, are formed with through holes for engaging a tool "T" with a head part of the downward bolt from an upper side with respect to the blade holding member 37 (in other words, from an upper side with respect to the hand 14 which is disposed uppermost).

Even in this case, similarly to the embodiment described above, arbitrary blade holding members of the blade holding members 37 through 47 are capable of being individually attached to and detached from the fixing members 49 through 59 together with their blades 36 without detaching other blade holding members 37 through 47 from the fixing members 49 through 59. Further, also in this case, a size of a base end side portion of the mounting mechanism 3 can be reduced. In this embodiment, in a case that a hand having a downward bolt exists among the hands 15 through 23, the hand having the downward bolt is a second hand.

In the embodiment described above, the head part 71a of the bolt 71 may be disposed on an upper side of the shaft part of the bolt 71. In this case, all of the blade holding members 37 through 46 and all of the fixing members 49 through 58, which are disposed on an upper side with respect to the bolt 71, are formed with through holes for engaging a tool "T" with the head part 71a from an upper side with respect to the blade holding member 37. Further, in the embodiment described above, the bolts 62 through 71 are successively shifted toward an inner side in the right and left direction from the hand 15 disposed on an upper side to the hand 24 disposed on a lower side. However, the bolts 62 through 71 may be disposed at random in the right and left direction.

In the embodiment described above, each of the blade holding members 37 through 47 and the blade 36 may be integrally formed with each other. In other words, a mounting part for a wafer 2 may be structured of one integrally formed component. Further, in the embodiment described above, the bolts 61 through 71 may be a bolt other than a bolt with a hexagonal hole. Further, in the embodiment described above, the blade holding members 37 through 47 may be fixed to the fixing members 49 through 59 by two or three bolts 61 through 71, or may be fixed to the fixing members 49 through 59 by five or more bolts 61 through 71.

In the embodiment described above, each of the blade holding members 37 through 47 may be disposed on a lower side of each of the front end parts of the fixing members 49 through 59. In this case, a screw hole is formed in the blade holding member 37 and each of the fixing members 50 through 59, and the blade holding members 38 through 47 and the fixing member 49 are formed with an arrangement hole in which the head parts 61a through 71a and the like are disposed. Further, in the embodiment described above, the number of the hands provided in the mounting mechanism 3 may be not less than three and not more than ten, or the number may be not less than twelve.

In the embodiment described above, the robot 1 may include no hand 4. In this case, the linear drive mechanism 6 and the like are not required. Further, in the embodiment described above, the robot 1 may include no inclination correcting mechanism 8. In addition, in the embodiment described above, the robot 1 may be a horizontal multi joint type robot. In this case, instead of the linear drive mechanisms 5 through 7, the robot 1 includes a multi joint arm in which the mounting mechanism 3 is turnably connected with its tip end part and a multi joint arm in which the hand 4 is turnably connected with its tip end part. Further, in the embodiment described above, the robot 1 may convey a conveyance object other than a wafer 2. For example, the robot 1 may convey a glass substrate for a liquid crystal display device.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot, comprising:
   a mounting mechanism, on which a plurality of conveyance objects is mounted, wherein
   the mounting mechanism comprises a plurality of hands whose number is at least three or more, each of the hands comprising a mounting part for the conveyance object, and the plurality of the hands being overlapped with each other at a predetermined pitch in an upper and lower direction,
   each of the hands comprises:
      a blade holding member of the mounting part,
      a fixing member, to which the blade holding member is fixed, and
      a bolt, having a head for fixing the blade holding member to the fixing member,
   the fixing members of the plurality of the hands are overlapped with each other at the predetermined pitch in the upper and lower direction,
   the blade holding member is fixed to the fixing member in a state that the blade holding member is overlapped with the fixing member in the upper and lower direction by the bolt disposed with the upper and lower direction as an axial direction,
   when the bolt whose head part is disposed on a lower side is referred to as an upward bolt, and the bolt whose head part is disposed on an upper side is referred to as a downward bolt and, when each of the hands having the upward bolt except the hand disposed uppermost and except the hand disposed at a bottom among the plurality of the hands is referred to as a first hand, and each of the hands having the downward bolt except the hand disposed uppermost and except the hand disposed at the bottom among the plurality of the hands is referred to as a second hand,
   in a case that the mounting mechanism comprises the first hand, all of the fixing members and the blade holding members of the hands which are disposed on a lower side with respect to the upward bolt of the first hand are formed with through holes for engaging a tool with the head part of the upward bolt of the first hand from a lower side with respect to the hand disposed at the bottom, and
   in a case that the mounting mechanism comprises the second hand, all of the fixing members and the blade holding members of the hands which are disposed on an upper side with respect to the downward bolt of the second hand are formed with through holes for engaging a tool with the head part of the downward bolt of the second hand from an upper side with respect to the hand disposed uppermost, and
   an inside diameter of the through hole is larger than an outside diameter of the head part.

2. The industrial robot according to claim 1, wherein
   the bolt provided in the hand disposed uppermost is the downward bolt, and
   the bolts provided in remaining hands of the plurality of the hands except the hand disposed uppermost are the upward bolts.

3. The industrial robot according to claim 2, wherein
each of the hands is linearly moved in a horizontal direction at a time of conveyance of the conveyance object, when a direction perpendicular to a moving direction of each of the hands and the upper and lower direction is referred to as an orthogonal direction, the blade holding member is fixed to the fixing member by the bolts disposed on both sides in the orthogonal direction with respect to a center of each of the hands in the orthogonal direction, and the bolts provided in the remaining hands of the plurality of the hands except the hand disposed uppermost are successively shifted to an inner side in the orthogonal direction from the hand disposed on an upper side to the hand disposed on a lower side.

4. The industrial robot according to claim 1, wherein
the mounting part comprises a mounting part main body on which the conveyance object is mounted, and the mounting part main body is separately formed from the blade holding member.

* * * * *